US010921113B1

(12) United States Patent
Schleif et al.

(10) Patent No.: US 10,921,113 B1
(45) Date of Patent: *Feb. 16, 2021

(54) SYSTEM AND METHOD FOR OPTICAL MEASUREMENTS IN A ROTARY MACHINE

(71) Applicant: General Electric Company, Schenectady, NY (US)

(72) Inventors: Kurt Kramer Schleif, Greenville, SC (US); Andrew David Ellis, Simpsonville, SC (US)

(73) Assignee: General Electric Company, Schenectady, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/669,466

(22) Filed: Oct. 30, 2019

(51) Int. Cl.
*G01B 11/00* (2006.01)
*G01R 31/34* (2020.01)
*G01B 21/04* (2006.01)

(52) U.S. Cl.
CPC .......... *G01B 11/005* (2013.01); *G01R 31/343* (2013.01); *G01B 21/042* (2013.01)

(58) Field of Classification Search
CPC ... F01D 21/003; F01D 11/14; G01B 11/2433; G01B 11/14; G01B 11/2408; G01B 7/14; G01B 11/00; G01B 11/105; F03D 17/00
See application file for complete search history.

(56) References Cited

U.S. PATENT DOCUMENTS

| | | | | | |
|---|---|---|---|---|---|
| 3,604,940 | A | * | 9/1971 | Matthews | G01B 11/2408 356/638 |
| 3,605,729 | A | * | 9/1971 | Liu et al. | A61B 5/09 600/539 |
| 3,766,387 | A | * | 10/1973 | Heffan | G01N 23/18 378/58 |
| 3,908,444 | A | * | 9/1975 | Peter | G01B 11/14 73/655 |
| 4,092,537 | A | * | 5/1978 | Stewart | F01D 21/003 378/51 |
| 4,326,804 | A | * | 4/1982 | Mossey | G01B 11/14 250/224 |
| 4,845,769 | A | * | 7/1989 | Burstein | G01N 23/04 378/58 |
| 5,313,513 | A | * | 5/1994 | Prindiville | G01N 23/046 378/20 |
| 8,054,939 | B2 | * | 11/2011 | Gordon, III | G01N 23/083 378/58 |
| 8,126,254 | B2 | * | 2/2012 | Lasa | B24B 19/14 356/3.08 |
| 2005/0159079 | A1 | * | 7/2005 | Astigarraga Castanares | B24B 5/36 451/5 |

(Continued)

OTHER PUBLICATIONS

U.S. Appl. No. 16/669,463, filed Oct. 30, 2019, Kurt Kramer Schleif.

(Continued)

*Primary Examiner* — Steven Whitesell Gordon
(74) *Attorney, Agent, or Firm* — Fletcher Yoder, P.C.

(57) ABSTRACT

A system is provided with a measurement system having a light source, a plurality of light sensors, and a controller coupled to the light source and the plurality of light sensors. The controller is configured to monitor one or more parameters between a rotor and a casing at least partially based on an interruption or a transmission of light from the light source to the plurality of light sensors.

20 Claims, 15 Drawing Sheets

(56) References Cited

U.S. PATENT DOCUMENTS

2018/0340441 A1\* 11/2018 Miyamoto .............. F01D 11/20
2019/0353473 A1\* 11/2019 Warren ................ F01D 21/003

OTHER PUBLICATIONS

U.S. Appl. No. 16/669,455, filed Oct. 30, 2019, Kurt Kramer Schleif.
U.S. Appl. No. 16/668,602, filed Oct. 30, 2019, Kurt Kramer Schleif.
U.S. Appl. No. 16/668,846, filed Oct. 30, 2019, Kurt Kramer Schleif.

\* cited by examiner

FIG. 9

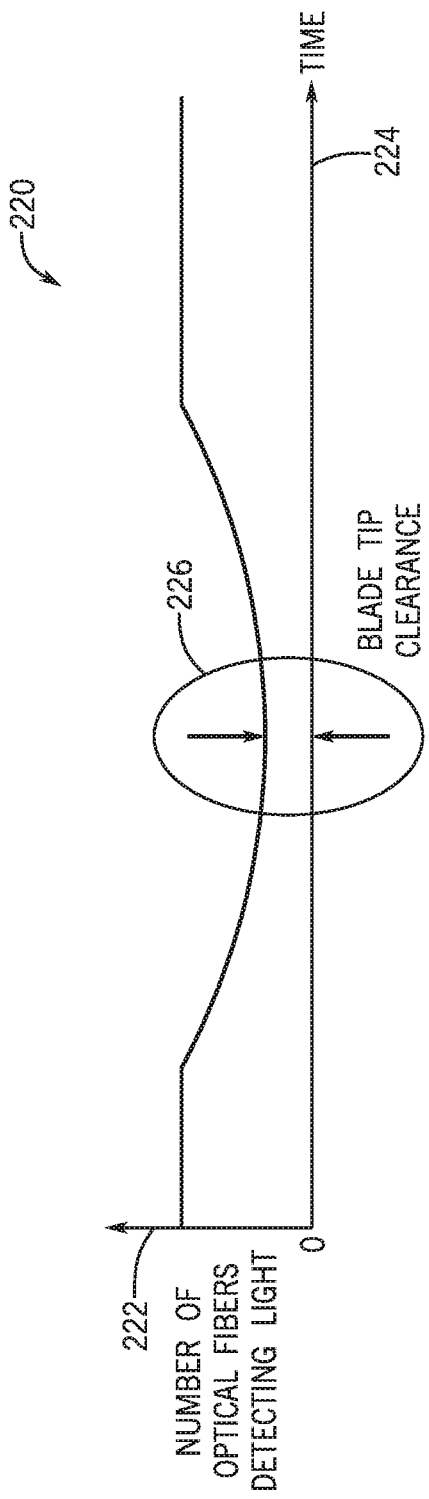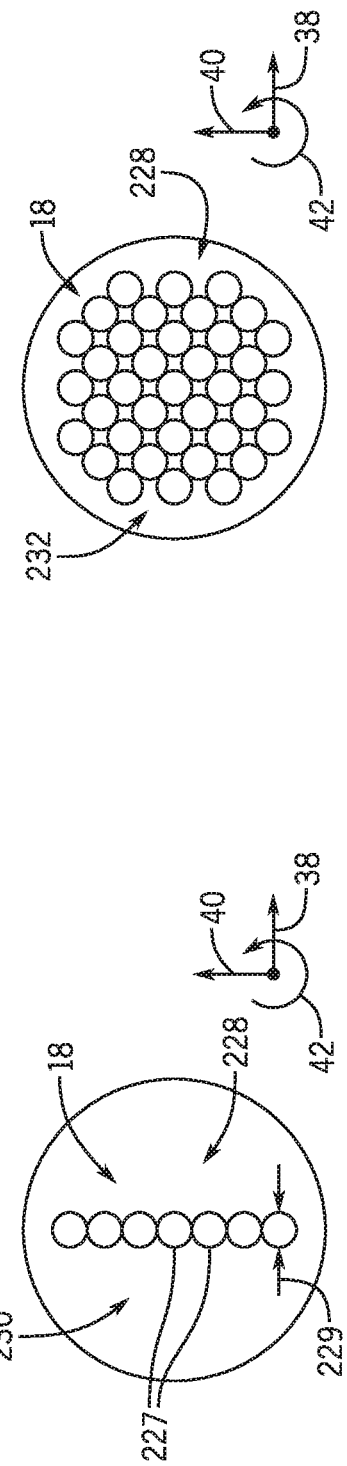

US 10,921,113 B1

SYSTEM AND METHOD FOR OPTICAL MEASUREMENTS IN A ROTARY MACHINE

BACKGROUND

The subject matter disclosed herein relates to clearance measurements and, more specifically, to measurements of clearance between rotating and stationary components in a rotary machine, such as a compressor of a gas turbine engine.

Compressors are used in a variety of industries and systems to compress a gas, such as air. For example, gas turbine engines typically include a compressor to provide compressed air for combustion and cooling. Compressors include a rotor assembly and a stator assembly. In multi-stage compressors, the rotor assembly may include multiple rows (e.g., rotor stages), each row having multiple rotor blades attached to one or more rotor wheels that define a shaft. Likewise, the stator assembly may include multiple rows (e.g., stator stages), each row having multiple stator vanes attached to a casing that circumscribes the rotor blades. The rotor assembly is designed to rotate with respect to the stator assembly, compressing an intake fluid as the fluid traverses the compressor. A clearance between the rotor assembly and the stator assembly may be associated with an efficiency of the compressor. However, sensors used to measure the clearance require a radial bore for installation, which creates a potential leak path.

BRIEF DESCRIPTION

Certain embodiments commensurate in scope with the originally claimed subject matter are summarized below. These embodiments are not intended to limit the scope of the claimed invention, but rather these embodiments are intended only to provide a brief summary of possible forms of the subject matter. Indeed, the present system may encompass a variety of forms that may be similar to or different from the embodiments set forth below.

In a first embodiment, a system includes a measurement system having a light source, a plurality of light sensors, and a controller coupled to the light source and the plurality of light sensors. The controller is configured to monitor one or more parameters between a rotor and a casing at least partially based on an interruption or a transmission of light from the light source to the plurality of light sensors.

In a second embodiment, a system includes a measurement system having a sensor mount with a top surface, a light source coupled to the sensor mount, and a plurality of light sensors coupled to the sensor mount. The light source is circumferentially spaced apart from the plurality of light sensors. The measurement system is configured to monitor one or more parameters at least partially based on an interruption or a transmission of light from the light source to the plurality of light sensors.

In a third embodiment, a method includes transmitting light from a light source toward a plurality of light sensors in a curved surface along a rotational path between a rotor and a casing. The method further includes monitoring one or more parameters between the rotor and the casing at least partially based on an interruption or a transmission of light from the light source to the plurality of sensors.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein:

FIG. 9 is an embodiment of a look-up table that may be used to measure the clearance between the casing and the blade based on data obtained from the sensor assembly of FIG. 8;

FIG. 14 is a graph representative of an embodiment of data obtained from the sensor assembly of FIGS. 12 and 13 that may be used to determine a clearance between the casing and the blade of the rotor assembly;

FIG. 15 is a schematic view of an embodiment of a plurality of light sensors of the sensor assembly of FIGS. 12 and/or 13, illustrating the light sensors arranged in a tightly packed column or array;

FIG. 16 is a schematic view of an embodiment of a plurality of light sensors of the sensor assembly of FIGS. 12 and/or 13, illustrating the light sensors arranged in a tightly packed cluster or two-dimensional bundle;

DETAILED DESCRIPTION

Figure 1:
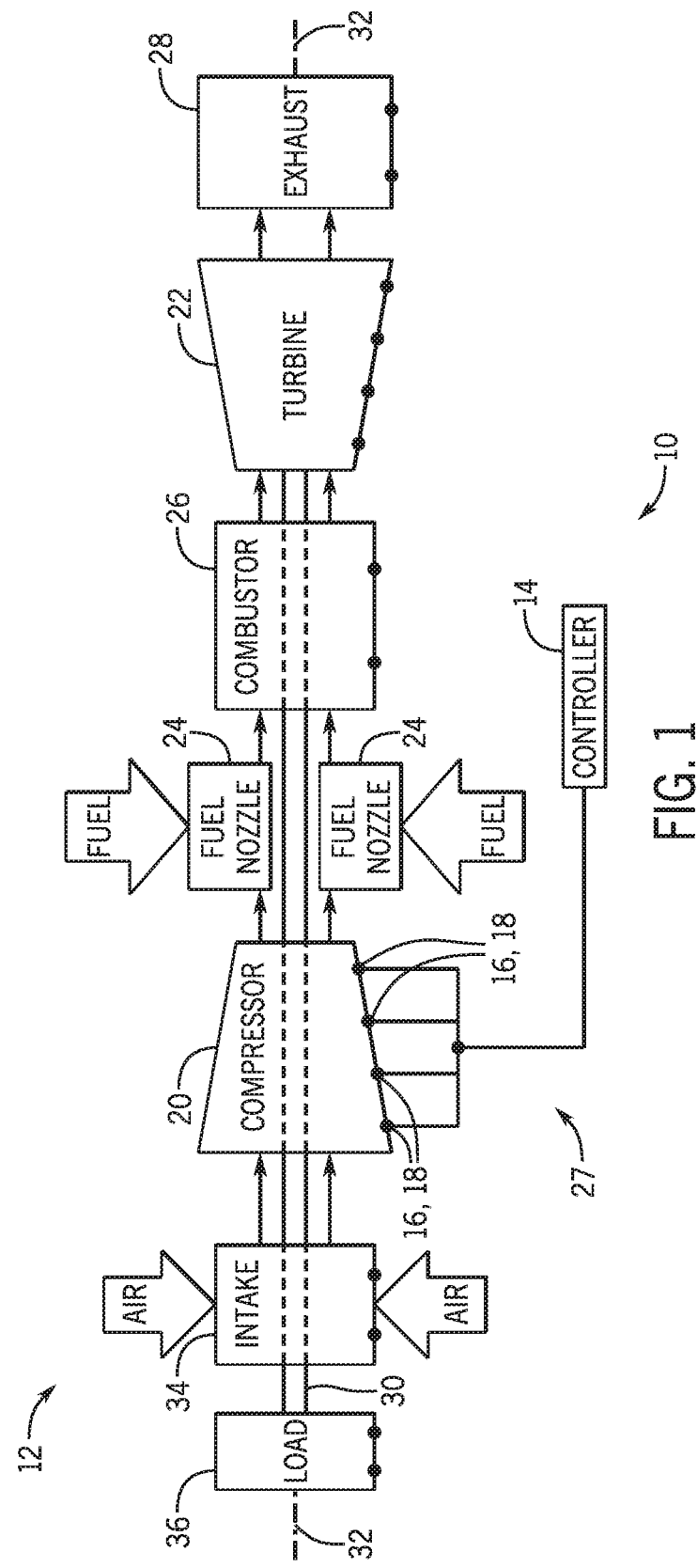
FIG. 1 is a block diagram of an embodiment of a gas turbine system having a multi-stage axial compressor with a sensor assembly coupled to a controller.

One or more specific embodiments of the present subject matter will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements.

The disclosed embodiments are directed to measuring a clearance between a rotor assembly (e.g., a rotor, blades, or both) and a stator assembly (e.g., a casing, vanes, or both) of a machine, such as a compressor, a pump, a turbine, or another rotary machine. For example, the disclosed embodiments include optical or light-based measurements of a clearance between rotor blades and a casing of a compressor.

In certain embodiments, a compressor of a turbine system may include multiple stages or rows of rotor blades configured to be rotated to compress a gas (e.g., air), which is then delivered to fuel nozzles and/or combustors for combustion processes. During rotation, the tips of the rotor blades (e.g., compressor blades) are spaced a relatively small distance away from an internal surface of a casing of the compressor. Particularly, the spacing or clearance between the compressor blade tips and the casing may be minimal, such that the rotor blades efficiently compress the air while not contacting the casing.

In some instances, the clearance between the rotor blades and the casing may change over time. For example, during normal operation, the clearance may change due to thermal expansion and contraction of the rotating and stationary parts of the machine, e.g., the casing, the blades, etc. The clearance also may vary over each revolution of the rotor if the geometry of the rotor or casing becomes less round, i.e., out-of-round condition. A more severe out-of-round condition will result in a greater variation in the clearance per revolution of the rotor. Other causes for variation in the clearance may include degradation of the rotor blades, vibrations or oscillations in the compressor, cracks or broken tips of the rotor blades, and rub conditions resulting in partial removal of the tips of the rotor blades.

In some instances, to detect the clearance between the rotor blades and the casing, an operator may drill holes angled radially toward a longitudinal axis of the compressor. The operator may then insert sensors (e.g., proximity sensors) into the holes to detect blade tip clearance in the radial direction. However, such clearance measurement methods may be inaccurate and inefficient. That is, it may be difficult to ensure the radial orientation of the holes and of the sensors as well as the circumferential locations of the holes and of the sensors. As such, the inconsistencies between orientations and locations of the sensors may provide difficulty in calibrating gathered measurement data. Moreover, the radial holes create a potential leak path in the casing, which can create additional maintenance issues. An excess of radial holes in the casing can also impact the structural integrity of the casing.

Accordingly, as discussed in further detail below, the disclosed embodiments include systems and methods for determining blade tip clearance of a compressor using secant-oriented sensors and light sources disposed within internal tracks of a casing of the compressor. For example, in certain embodiments, the system may utilize tracks (e.g., channels) disposed circumferentially along an internal surface of the casing. The tracks may be configured to receive arcuate mounts that may hold a sensor assembly configured to be utilized to determine blade tip clearance. The sensor assembly may include one or more light sources and one or more light sensors and may be communicatively coupled to a controller. That is, the sensor assembly and the controller may collectively form a measurement system configured to determine blade tip clearance. The light sources and the light sensors are configured to gather data indicative of blade tip clearance, and the controller is configured to determine the blade tip clearance and other measurements based on the gathered data.

To illustrate, the light sources are configured to direct light from a first location (e.g., a first circumferential position or area) on an internal surface of the casing to a second location (e.g., a second circumferential position or area) on the internal surface of the casing. Indeed, the light sensors may be located at the second location to detect the light. In other words, one or more light sources may emit one or more lights as secants across the internal surface (e.g., curved surface or inner circumference) of the casing towards one or more light sensors.

In certain embodiments, a light source may emit a collimated light toward a corresponding light sensor. The collimated light may be interrupted (e.g., blocked) by individual rotor blades passing through the collimated light. Accordingly, the blade tip clearance to the internal surface of the casing may be based on a duration of time that the collimated light is broken or interrupted. Further, in certain embodiments, multiple light sources may emit multiple collimated lights that are radially stacked parallel to one another (e.g., parallel beams of light at different radial heights) across the internal surface of the casing toward multiple, similarly stacked light sensors. The stacked collimated lights may be broken by the rotor blades passing through the collimated lights. Accordingly, the blade tip clearance to the internal surface of the casing may be based on respective positions of the collimated lights that are broken by the rotor blades.

Further still, in certain embodiments, the light source may emit a light towards a group (e.g., an array) of sensors. The light may be a diverging light, such as a light beam that is conical in shape. A portion of the light may be broken by the rotor blades passing through the light. Accordingly, the blade tip clearance may be based on a number of sensors of the group of sensors that are not detecting light as the rotor blade passes through the light.

Further, in some embodiments, in addition to blade tip clearance, the measurement system may detect roundness or curvature of the casing, e.g., an out-of-round condition (e.g., deviation from a circular shape) and severity of such condition. For example, in some embodiments, a curvature of the casing may change (e.g., deform) over time due to stresses experienced during normal operation. As discussed in further detail below, the measurement system is configured to detect such changes in the roundness. In some embodiments, the measurement system may monitor the blade tip clearance and the curvature of the casing over time and may identify variations in the blade tip clearance and curvature over time. These variations of blade tip clearance and the curvature of the casing may be evaluated to detect oscillations and/or vibrations in the compressor.

FIG. 1 is a block diagram of an embodiment of a turbine system 10 that includes a gas turbine engine 12 and a controller 14 (e.g., electronic and/or processor-based controller). The illustrated gas turbine engine 12 includes a compressor 20 (e.g., a multi-stage axial compressor or compressor section), a turbine 22 (e.g., a multi-stage turbine or turbine section), and fuel nozzles 24 coupled to one or more combustors 26 (e.g., a combustor section). The compressor 20 and turbine 22 each may have any number of stages (e.g., rows) of rotor blades and stator vanes (e.g., 1 to 20). The controller 14 may be communicatively coupled to sets of light sources 16 (e.g., lasers) and light sensors 18 (e.g., fiber optic sensors/detectors) disposed in a casing of the compressor 20.

For example, data collected by the light sensors 18 may be used to determine a clearance between rotor blades and a casing of the compressor 20. As discussed in detail below, the controller 14 may receive the data from the light sensors 18, and may determine (e.g., calculate or measure) a blade tip clearance and other operational parameters of the compressor 20 based on the collected data. As discussed herein, the light sensors 18, the light sources 16, and the controller 14 collectively form a measurement system 27. Although the following discussion presents embodiments of the measurement system 27 in context of the compressor 20, the measurement system 27 (e.g., light sources 16, light sensors 18, and controller 14) may be coupled to any rotary machine, such as the turbine 22, a pump, a steam turbine, a hydro turbine, or any combination thereof. Before presenting details of the measurement system 27, the following discussion provides a brief description of the gas turbine engine 12 and its operation.

In operation, the compressor 20 is configured to compress a compressible fluid (e.g., gas such as air, oxygen, and/or exhaust gas), and deliver the compressed fluid to the fuel nozzles 24 and/or the combustors 26. Although the compressible fluid may include any suitable gas, the following discussion may generally refer to the compressible fluid as an oxidant (e.g., air) as one non-limiting example. The fuel nozzles 24 are configured to supply fuel (e.g., from one or more fuel supplies) into the one or more combustors 26 (e.g., in combustion chambers), which combust the fuel with the oxidant (e.g., air) to generate hot combustion gases to drive the turbine 22. The fuel nozzles 24 may be designed as pre-mix fuel nozzles 24 and/or diffusion fuel nozzles 24. Pre-mix fuel nozzles 24 mix the fuel with the oxidant (e.g., air) to create pre-mix type flames. Diffusion fuel nozzles 24 do not premix the fuel with the oxidant, and thus create diffusion type flames. Regardless of the type of flames, the hot combustion gas flows from the combustors 26 into the turbine 22, thereby driving rotation of one or more stages of turbine blades coupled to a turbine rotor and shaft 30 along an axis 32. Eventually, the hot combustion gas exits the turbine 22 through an exhaust outlet 28 (e.g., exhaust stack, exhaust end).

In the illustrated embodiment, the shaft 30 is coupled to the compressor 20 and a load 36, such that rotation of the shaft 30 also drives rotation of the compressor 20 and the load 36. The compressor 20 may intake the oxidant (e.g., air) through an air intake 34, which may include filters, thermal control systems, or any other preconditioning systems. The load 36 may include an electrical generator, a rotary machine, a propulsion system of a vehicle, or any other suitable device.

The compressor 20 may include alternating rows of rotating blades and stationary vanes (e.g., airfoils) that may be disposed in multiple stages, described in more detail below. The oxidant (e.g., air) may be progressively compressed in stages or rows of rotating blades and corresponding stator vanes as the air moves downstream in the compressor 20. In the depicted embodiment, the compressor 20 is a multi-stage axial compressor 20 having at least two rows or stages of blades and vanes. For example, in certain embodiments, the multi-stage axial compressor 20 may have any number (e.g., any number from 2 to 14 or more) of rows or stages of compressor blades and vanes.

Figure 2:
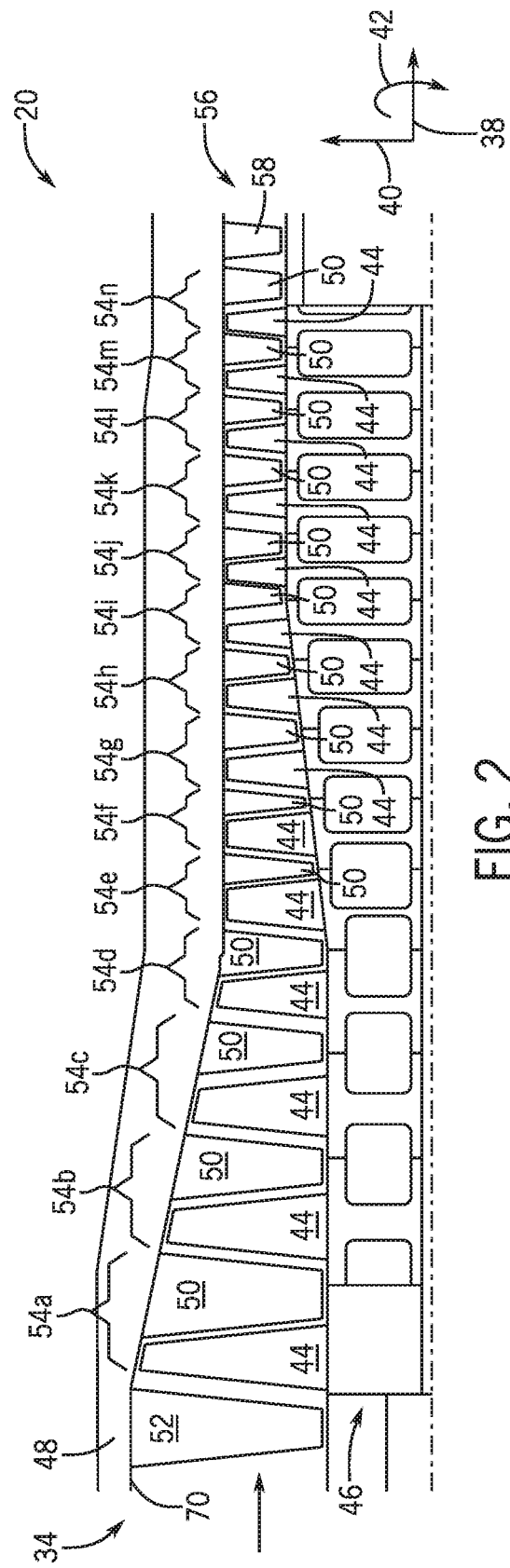
FIG. 2 is a cross-sectional side view of an embodiment of the gas turbine engine of FIG. 1, illustrating stages of blades of a rotor assembly and vanes of a stator assembly of the multi-stage axial compressor.

It may be beneficial to illustrate a more detailed view of certain components of the gas turbine engine 12. Accordingly, FIG. 2 is a cross-sectional side view of an embodiment of the compressor 20 of the gas turbine engine 12 of FIG. 1. Throughout the discussion of FIG. 2, a set of axes will be referenced. These axes are based on a cylindrical coordinate system and point in an axial direction 38 (e.g., downstream), a radial direction 40, and a circumferential direction 42. For example, the axial direction 38 extends downstream through the compressor 20 generally parallel to the axis 32, the radial direction 40 extends away from the axis 32, and the circumferential direction 42 extends around the axis 32.

In operation, air enters the compressor 20 in the axial direction 38 through the air intake 34 and may be pressurized in the multi-stage axial compressor 20. The compressed air may then be mixed with fuel for combustion within the combustor 26 to drive the turbine 22 to rotate the shaft 30 in the circumferential direction 42 and, thus, the multi-stage axial compressor 20 and the load 36. The rotation of the shaft 30 also causes one or more blades 44 (e.g., compressor rotor blades) within the multi-stage axial compressor 20 to draw in and pressurize the air received by the air intake 34.

The multi-stage axial compressor 20 may include a rotor assembly 46 having multiple rotor blades 44 surrounded by a static casing 48 (e.g., stator, housing or outer wall) having multiple stator vanes 50. In some embodiments, the static casing 48 of the compressor 20 or the air intake 34 may have one or more sets of inlet guide vanes 52 (IGVs) (e.g., variable IGV stator vanes) that may control flows into the compressor 20. The compressor 20 may include a plurality of rows or stages 54, such as between 2 to 30, 2 to 25, 2 to 20, 2 to 14, or 2 to 10 rows or stages, or any specific number or range therebetween. In each stage, the multi-stage axial compressor 20 may include 2 to 1000, 5 to 500, or 10 to 100 rotor blades 44, and a corresponding and adjacent set of 2 to 1000, 5 to 500, or 10 to 100 stator vanes 50.

In particular, the illustrated embodiment of the multi-stage axial compressor 20 includes 14 stages (designated as 54a through 54n), although greater or fewer stages 54 may be used. It may be appreciated that each stage 54 has a set of rotor blades 44 disposed at a first axial position and a set of stator vanes 50 disposed at a second axial position along the length of the compressor 20 adjacent the set of rotor blades 44. In other words, each stage 54 has the rotor blades 44 and stator vanes 50 axially offset from one another, such that the compressor 20 has an alternating arrangement of rotor blades 44 and stator vanes 50 one set after another along the length of the compressor 20. Each set of rotor blades 44 extends (e.g., in a spaced arrangement) in the circumferential direction 42 about the shaft 30, and each set of stator vanes 50 extends (e.g., in a spaced arrangement) in the circumferential direction 42 within the static casing 48.

In use, the rotor blades 44 may rotate circumferentially about the axis 32 and relative to the static casing 48 and the stator vanes 50. Rotation of the rotor blades 44 may result in air entering the air intake 34. The air is then subsequently compressed as it traverses the various stages 54 of the compressor 20 and moves in the axial direction 38 downstream of the multi-stage axial compressor 20. The compressed air may then exit through an outlet 56 of the multi-stage axial compressor 20. The outlet 56 may have a set of exit guide vanes 58 (EGVs). The compressed air that exits the compressor 20 may be mixed with fuel, directed to the combustor 26, directed to the turbine 22, or used elsewhere in the turbine system 10.

The compression of the air as it travels through the compressor 20 may be based at least in part on clearances between the rotor (e.g., the rotor blades 44) and the stator (e.g., the casing 48 and the stator vanes 50) of the compressor 20. Minimization of these clearance may result in increased compression of the air. More specifically, the clearance between the rotor blades 44 and an internal surface 70 of the casing 48 may have a direct correlation with an air compression efficiency of the compressor 20. Indeed, the lesser the clearance between the rotor blades 44 and the internal surface 70, the greater the efficiency of the compressor 20 in compressing the air. As such, the clearance (e.g., a blade tip clearance) between the rotor blades 44 and the internal surface 70 of the casing 48 may be monitored. In some embodiments, operation of the compressor 20 may be based on the blade tip clearance to enhance an efficiency of the compressor 20. For example, in some embodiments, a position of the rotor blades 44 may be adjusted or maintenance may be performed on the compressor 20, based on the blade tip clearance.

Figure 3:
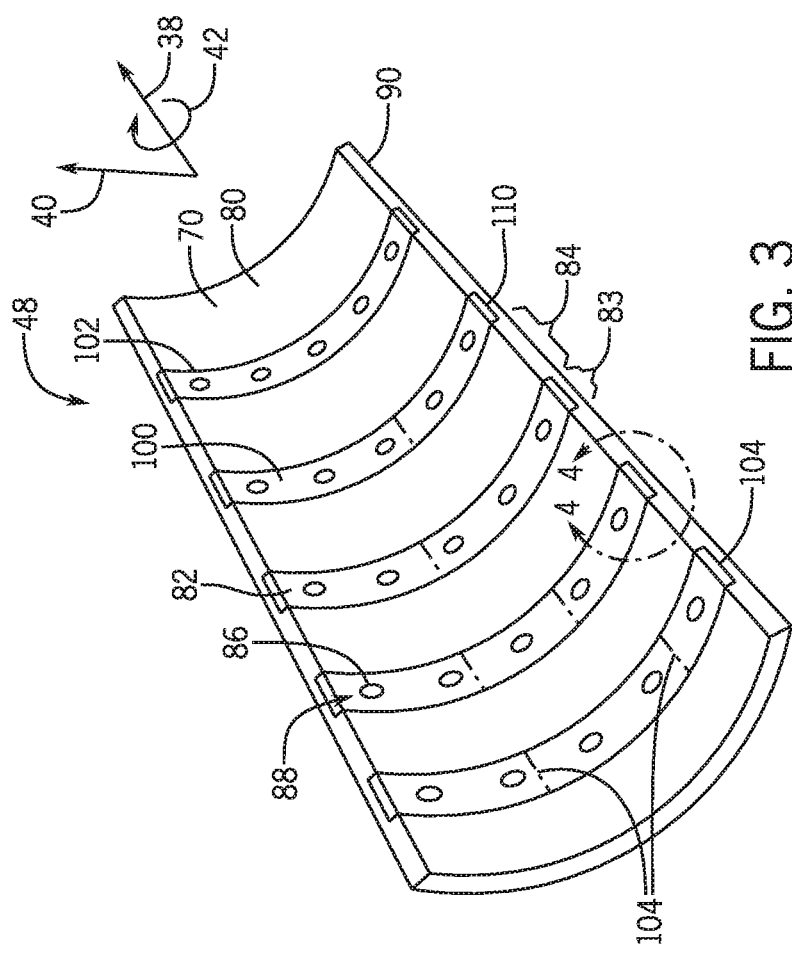
FIG. 3 is a perspective view of an embodiment of a portion of a casing of the compressor of FIG. 1, illustrating a plurality of sensor mounts coupled to an internal surface of the casing.

As discussed herein, the casing 48 of the compressor 20 is configured to house the light sensors 18 and the light sources 16, which are used to gather data indicative of clearances between the rotor blades 44 and the internal surface 70 of the casing 48. Keeping this in mind, FIG. 3 is a perspective view of an embodiment of the casing 48 of the compressor 20. Particularly, FIG. 3 is a perspective view of a casing portion 80 of the casing 48 of the compressor 20. Indeed, in some embodiments, the casing 48 may be composed of multiple casing portions 80, which may be coupled together to form the casing 48. For example, the casing 48 may include two, three, four, or more casing portions 80 spaced circumferentially 42 about the axis 32 to form a full circumference of the casing 48. The casing 48 extends circumferentially 42 about the rotor assembly 46 of the compressor 20.

As illustrated in FIG. 3, the casing 48 may include one or more mounts 82 (e.g., arcuate mounts, inserts) coupled to the internal surface 70 of the casing 48. Further, the casing 48 may include rotor blade areas 83 and stator vane areas 84 extending in the circumferential direction 42 about the internal surface 70 and alternating along the axial direction 38. The rotor blade areas 83 may be areas along which tips of the rotor blades 44 (FIG. 2) are configured to pass. In other words, the rotor blade areas 83 may be axially 38 and radially 40 aligned with the rotor blades 44 when the casing 48 is coupled to the rotor assembly 46. Although not explicitly shown, the stator vane areas 84 may include the stator vanes 50 (FIG. 2) extending from the internal surface 70 of the casing 48. Indeed, it should be noted that the illustration has been intentionally simplified to focus attention on certain aspects, as discussed herein. That is, the casing 48 may include additional elements (e.g., the stator vanes 50) that are not explicitly shown in the exemplary illustration.

The mounts 82 may be coupled to the internal surface 70 of the casing 48 at the rotor blade areas 83. In some embodiments, location of the mounts 82 may define the rotor blade areas 83. The mounts 82 may further include housing structures 86 configured to provide housing to sensor assemblies 88 (e.g., the light sensors 18 and/or the light sources 16). The housing structures 86 may be imbedded within the mounts 82 such that the sensor assemblies 88 may be disposed beneath the internal surface 70 of the casing 48. In other words, the sensor assemblies 88 may be disposed radially 40 between the internal surface 70 of the casing and an external surface 90 of the casing 48. Accordingly, as will be appreciated, the sensor assemblies 88 are configured to detect a presence and clearance of the rotor blades 44 as the rotor blades 44 pass along the mount 82.

A curvature of the mounts 82 may substantially match the curvature of the internal surface 70 of the casing 48. In this manner, when the mounts 82 are coupled to the casing 48 (as shown), a top surface 100 of the mounts 82 may be substantially flush with the internal surface 70 of the casing 48. Particularly, the internal surface 70 of the casing 48 may include tracks 102 (e.g., channels) configured to receive the mounts 82. Particularly, each track 102 may be disposed along the internal surface 70 of the casing 48 in the circumferential direction 42, such as within the rotor blade areas 83.

In some embodiments, each track 102 may be configured to receive multiple mounts 82. That is, each mount 82 may include opposite circumferential ends 104. In some embodiments, the circumferential ends 104 of adjacent mounts 82 may be in contact or may be coupled together when the mounts 82 are inserted into the tracks 102. Indeed, as shown, each mount 82 may include any suitable respective arcuate length extending between the circumferential ends 104. In this way, any suitable number of mounts 82 may be inserted into each track 102. For example, each casing portion 80 may include a single mount 82 in each track 102, e.g., sized to substantially match a circumferential 42 length of the casing portion 80. Alternatively, each casing portion 80 may include 2, 3, 4, 5, 6 or more mounts 82 of equal or different circumferential 42 length sized to collectively fit within each track 102 in the casing portion 80. Furthermore, the disclosed embodiments may include a plurality of different families of mounts 82, each family designed for a particular configuration of sensor assemblies 88, as discussed in further detail below.

Figure 4:
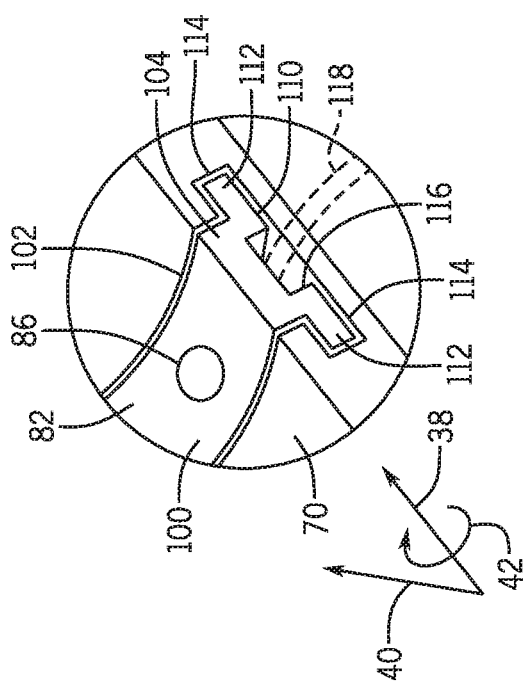
FIG. 4 is a partial perspective view of an embodiment of the casing of FIG. 3, taken within line 4-4, illustrating a circumferential end of one of the sensor mounts of FIG. 3 coupled to the casing.

Further, in some embodiments, the mounts 82 may include circumferential slots disposed opposite to the top surface 100 (e.g., within a bottom surface 110) configured to organize and route wires (e.g., conductors) coupled to the sensor assemblies 88. In this way, the wires from multiple locations of the housings 86 of the mount(s) 82 within one of the tracks 102 may be grouped together. As such, the wires from the sensor assemblies 88 disposed within one of the tracks 102 may be routed through a single or common bore in the casing 48 to, for example, the controller 14. In contrast to sensors requiring a radial bore for each individual sensor, the disclosed embodiment enables a substantial reduction in the number of bores and thus a reduction in the number of potential leak paths in the casing 48. To further illustrate, FIG. 4 is a partial cut-away perspective view of the casing 48 of FIG. 3, taken within dashed line 4-4, illustrating the circumferential end 104 of one of the mounts 82.

As shown, the mount 82 may be coupled to the track 102 such that the top surface 100 of the mount 82 is substantially flush with and contoured to match (e.g., to have substantially the same inner curvature of) the internal surface 70 of the casing 48. To couple with the track 102, the mount 82 may include opposite flanges 112 configured to engage with opposite recesses 114 of the track 102. In the illustrated embodiment, the opposite flanges 112 and the opposite recesses 114 extend in the axial 38 upstream and downstream directions, while also extending circumferentially 42 along a length of the mount 82 and the track 102.

Further, as shown, the bottom surface 110 of the mount 82 may include a circumferential slot 116. As mentioned above, the slot 116 may be configured to route wires 118 from sensor assemblies 88 disposed within the housing 86. In some embodiments, the slot 116 may be defined by a space disposed between the bottom surface 110 of the mount 82 and the track 102 and between the opposite flanges 112. In some embodiments, the slot 116 may be disposed completely internal to the mount 82 such that walls of the mount 82 encompass the slot 116. In this way, the wires 118 from a portion or all of the sensor assemblies 88 disposed within a respective track 102 may be grouped together and routed through a single outlet through the casing 80 to communicatively couple to an external device, such as the controller 114.

As will be appreciated, the housing 86 of the mounts 82 may allow for the light sensor 18 and the light source 16 to be oriented as secants (e.g., geometric chords) across the circumference of the internal surface 70. In other words, the sensor assemblies 88 may send and receive light across the internal surface 70 such that the light is not radially 40 oriented toward the axis 32 of the compressor 20. In certain embodiments, a portion or all of each mount 82 may be constructed of a transparent material configured to transmit light between the light source 16 and the light sensor 18, while also conforming to the inner curvature of the casing 48.

Generally, the sensor assemblies 88 are configured to transmit and receive light substantially linearly across the internal surface 70 of the casing 48. A portion of the light may pass through the transparent material of the mount 82, while the remaining portion (e.g., a majority) of the light may pass directly through the interior volume of the casing 48 in a tangential direction to facilitate clearance measurements. The rotor blades 44 may pass through (e.g., interrupt, block) the light. The light sensors 18 may gather various data as an effect of the rotor blades 44 passing through the light. The controller 14 may then receive the data and calculate the blade tip clearance, out of roundness, vibration, and other parameters, based on the various data received from the light sensors 18. For example, the received data may include a duration of light blockage of each beam of light between light sources 16 and light sensors 18, a number and position of blocked light beams between one or more light sources 16 and a plurality of light sensors 18, or a combination thereof. The controller 14 also may acquire other operational data, such as a rotational speed of the rotor and/or rotor blades 44.

Figure 5:
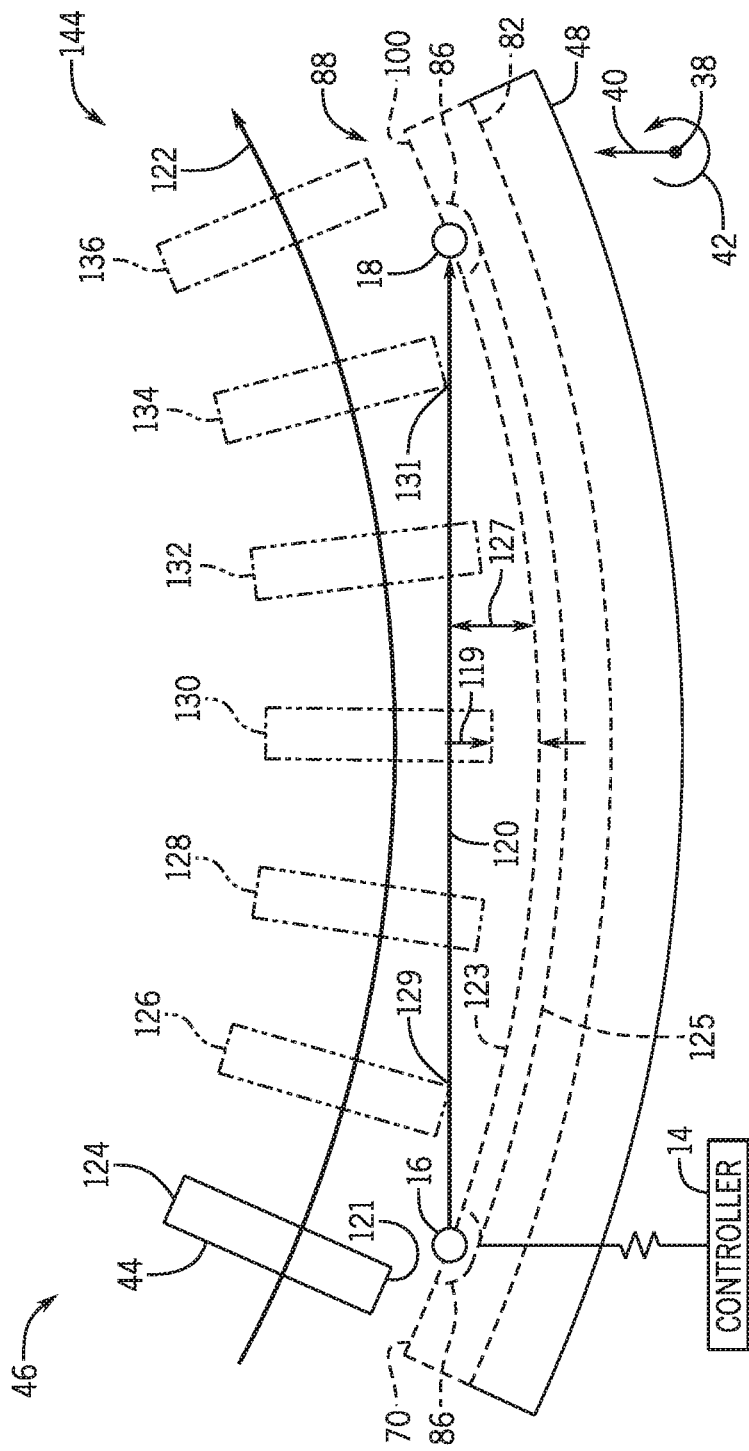
FIG. 5 is a cross-sectional schematic view of an embodiment of the sensor assembly having a light source and a light sensor coupled to one of the sensor mounts in the casing of FIG. 3, illustrating a blade of the rotor assembly moving along an inner circumference of the casing crossing a light path between the light source and the light sensor.

FIG. 5 is a cross-sectional schematic view of an embodiment of the sensor assembly 88 of the measurement system 27 having a light source 16 and a light sensor 18 coupled to one of the sensor mounts 82 in the casing 48 of FIG. 3, illustrating a blade 44 of the rotor assembly 46 moving along an inner circumference 70 of the casing 48 crossing a light path 120 (e.g., a secant along the inner circumference 70) between the light source 16 and the light sensor 18. The sensor assembly 88 is configured to detect a blade tip clearance 119 of a rotor blade 44 of a rotor assembly 46. For simplicity, FIG. 5 illustrates one rotor blade 44 of the rotor assembly 46. However, the rotor assembly 46 includes a plurality of rotor blades 44 coupled to a central rotor, hub, or shaft, wherein the rotor blades 44 are circumferentially 42 spaced about the axis 32. The blade tip clearance 119 may be defined as a distance, measured in the radial direction 40, from a distal end 121 of the rotor blade 44 to the internal surface 70 of the casing 48 and/or the top surface 100 of the mount 82.

As illustrated in the current embodiment, the sensor assembly 88 may include at least one light source 16 (e.g., a single light source 16) and at least one light sensor 18 (e.g., a single light sensor 18). Particularly, the sensor assembly 88 may be disposed in the housing 86 provided via the mount 82. In some embodiments, light source 16 and the light sensor 18 may be disposed in respective, distinct housings 86. In some embodiments, the light source 16 and the light sensor 18 may be disposed in a common housing 86. The light source 16 and the light sensor 18 may be substantially flush or recessed relative to the internal surface 70 (e.g., inner circumference) of the casing 48 and/or the mount 82.

Furthermore, the mount 82 may include a transparent portion 123 extending along the light path between the light source 16 and the light sensor 18. For example, in the illustrated embodiment and each embodiment disclosed herein, the entire mount 82 may be formed of a transparent material, or the mount 82 may include a transparent portion 123 (e.g., a transparent insert or injected transparent material) in a recess or slot 125 extending between the light source 16 and the light sensor 18. The outer surface of the transparent portion 123 may be contoured to substantially match the curvature of the internal surface 70 (e.g., inner circumference) of the casing 48 and/or the mount 82.

As shown, the light source 16 is configured to direct light 120 (e.g., a light beam, collimated light, a laser light) along a light path toward the light sensor 18. As context herein dictates, the reference number 120 will refer to either the light produced by the light source 16 or the light path between the light source 16 and the light sensor 18. As discussed herein, the light 120 may be collimated light, such as light with substantially no divergence and substantially parallel light rays. The light sensor 18 is configured to detect whether the light sensor 18 is receiving the light 120. That is, the rotor blade 44 may pass through the light 120, thereby preventing the light sensor 18 from receiving the light 120 while the rotor blade 44 is disposed within the path of the light 120 (i.e., blocking, obstructing or interrupting the light).

To illustrate, the rotor blade 44 may be configured to travel along a rotor path 122. The rotor path 122 may be substantially concentric with the internal surface 70 of the casing 48. However, as discussed below, in some embodiments, the rotor assembly 46 may oscillate or vibrate, which may similarly cause fluctuations in the rotor path 122. The rotor blade 44 is configured to travel continuously along the rotor path 122 from a first position 124 sequentially through a second position 126, a third position 128, a fourth position 130, a fifth position 132, a sixth position 134, and a seventh position 136. Indeed, although shown as distinct positions, it should be understood that the rotor blade 44 may continuously travel from the first position 124 through the seventh position 136 at a substantially constant rotational speed during clearance measurements. Further, it should be noted that the rotor path 122 may extend in the circumferential direction 42 along an entirety of the casing 48.

As shown, the rotor blade 44 may be disposed outside of the light 120 (e.g., not obstructing or blocking the light 120) while in the first position 124. The rotor blade 44 may then be disposed within the light 120 (e.g., obstructing or blocking the light 120) while in the second position 126 through the sixth position 134. While the rotor blade 44 is disposed within (e.g., blocking or interrupting) the light path of the light 120, the light sensor 18 does not receive (e.g., detect) the light 120. The rotor blade 44 may then be disposed outside of the light 120 while in the seventh position 136.

The light sensor 18 may send (e.g., communicate, transmit) a signal to the controller 14, wherein the signal is indicative of the duration of time that the light sensor 18 is receiving light and/or is not receiving light. For example, the light sensor 18 may send a signal to the controller 14 indicating the presence or absence of light, which may in turn correlate the signal (e.g., presence or absence of light) to a clock indicating a duration of the presence of light and a duration of the absence of light. The controller 14 also may receive sensor data from one or more additional sensors measuring parameters of the turbine system 10, such as a rotational speed of the compressor 20. The controller 14 may then compare the duration of the absence of light acquired from the light sensor 18 with the rotational speed of the rotor blade 44 to calculate the blade tip clearance 119. Indeed, the duration of time that the rotor blade 44 is obstructing the light 120 may be directly correlated to the blade tip clearance 119.

That is, a greater duration of time that the light 120 is blocked by the rotor blade 44 indicates a smaller blade tip clearance 119, while a lesser duration of time that the light 120 is blocked by the rotor blade 44 indicates a greater blade tip clearance 119. For example, if the light sensor 18 detects an absence of light for a duration of time that corresponds to an entire distance from the light source 16 to the light sensor 18 when considering the rotational speed of the rotor blade 44, then the controller 14 would calculate a blade tip clearance 119 at a minimum (e.g., approximately zero or substantially close to zero). In contrast, if the light sensor 18 detects an absence of light for a duration of time that corresponds to a negligible distance (e.g., 0.01 percent of the entire distance) from the light source 16 to the light sensor 18 when considering the rotational speed of the rotor blade 44, then the controller 14 would calculate a blade tip clearance 119 at a maximum (e.g., radial 40 distance between the internal surface 70 and the light path of the light 120) detectable by the measurement system 27. In a similar manner, the controller 14 is configured to calculate a blade tip clearance 119 between the minimum and the maximum when the duration of time of the absence of light falls somewhere between the examples noted above.

In certain embodiments, the controller 14 may store data correlating a beam height 127 to each position along the light path of light 120 from the light source 16 to the light sensor 18, a circumferential distance between the light source 16 and the light sensor 18, and a correlation between a particular beam height 127 and a circumferential distance between a starting point 129 and an ending point 131 of an interruption of the light path of light 120. Based on this correlation, the rotational speed, and the measured duration of time of absence of light, the controller 14 may be programmed to calculate the blade tip clearance 119. In some embodiments, the controller 14 may include a lookup table, an equation, a computer model, or other calculation technique configured to determine the blade tip clearance 119 based on the rotational speed, the measured duration of time of absence of light, and various known parameters.

Each of the sensor assemblies 88 may be configured to gather data indicative of the blade tip clearance 119 at respective clearance locations 144 (e.g., areas having circumferentially 42 spaced light sources 16 and light sensors 18) along the internal surface 70 of the casing 48. In the currently illustrated embodiment, the clearance location 144 may be defined by a circumferential distance (e.g., an angular distance or arc length) along the internal surface 70 of the casing 48 between the light source 16 and the light sensor 18. As such, the controller 14 may determine an approximation (e.g., an average) of the blade tip clearance 119 relative to the circumferential distance included in the clearance location 144 of the casing 48.

For example, in certain embodiments, the angular distance of each clearance location 144 may be 1 to 15 degrees, 1 to 10 degrees, or 1 to 5 degrees. In certain embodiments, the arc length of each clearance location 144 may be greater than zero and less than 1, 2, 3, 4, or 5 percent of a circumference of the internal surface 70 of the casing 48. The measurement system 27 may include sensor assemblies 88 having equal or different circumferential distances (e.g., angular distances or arc lengths) between light sources 16 and light sensors 18, which may be located at different circumferential positions spaced about the circumference of the internal surface 70 of the casing 48. In some embodiments, the clearance locations 144 may be disposed at 2, 3, 4, 5, 6, 7, 8, 9, 10, or more equally spaced circumferential positions of the casing 48. For example, the clearance locations 144 may be disposed at four circumferentially spaced positions of the casing 48, such as 3 o'clock, 6 o'clock, 9 o'clock, and 12 o'clock positions.

The controller 14 is configured to monitor sensor data and measure blade tip clearance 119 for the rotor blades 44 over time to: determine trends in the clearance 119, compare clearances 119 of multiple or all of the rotor blades 44 at each stage over each revolution, identify oscillations or vibrations in the rotor blades 44 and/or casing 48, identify sudden changes indicative of catastrophic events (e.g., blade tip breakage), compare clearances 119 between different stages of the compressor 20, predict future clearances 119 and the impact on compressor 20 efficiency, schedule maintenance or repair to correct any issues with unacceptable clearances 119, and control the system 10 based on measured clearances 119.

Figure 6:
FIG. 6 is a graph representative of an embodiment of data obtained from the sensor assembly of FIG. 5, illustrating a duration of obstruction of the light path used to determine a clearance between the casing and the blade of the rotor assembly.

FIG. 6 is a graph 150 representative of an embodiment of data obtained from the sensor assembly 88 of FIG. 5 and received by the controller 14, illustrating a duration of obstruction of the light path 120 used to determine a clearance 119 between the casing 48 and the blade 44 of the rotor assembly 46. The graph 150 may include a light detection axis 152 indicative of whether the light sensor 18 is receiving light. The graph 150 may further include a time axis 154 indicative of time. As shown, the light detection axis 152 may be binary. That is, the light sensor 18 may either be receiving light, indicated by a "1", or may not be receiving light, indicated by a "0". As shown, the light sensor 18 may not be receiving light from "t1" to "t2" of the time axis 154. Particularly, the rotor blade 44 may be blocking the light from "t1" to "t2". The controller 14 may determine the blade tip clearance 119 based on the duration of time that light sensor 18 is not receiving the light 120, a rotational speed of the rotor blade 44 measured by a speed sensor, and known parameters of the sensor assembly 88 (e.g., a circumferential distance between the light source 16 and the light sensor 18, the radius of the inner circumference of the casing 48, and/or the beam height 127 along the light path of light 120).

Figure 7:
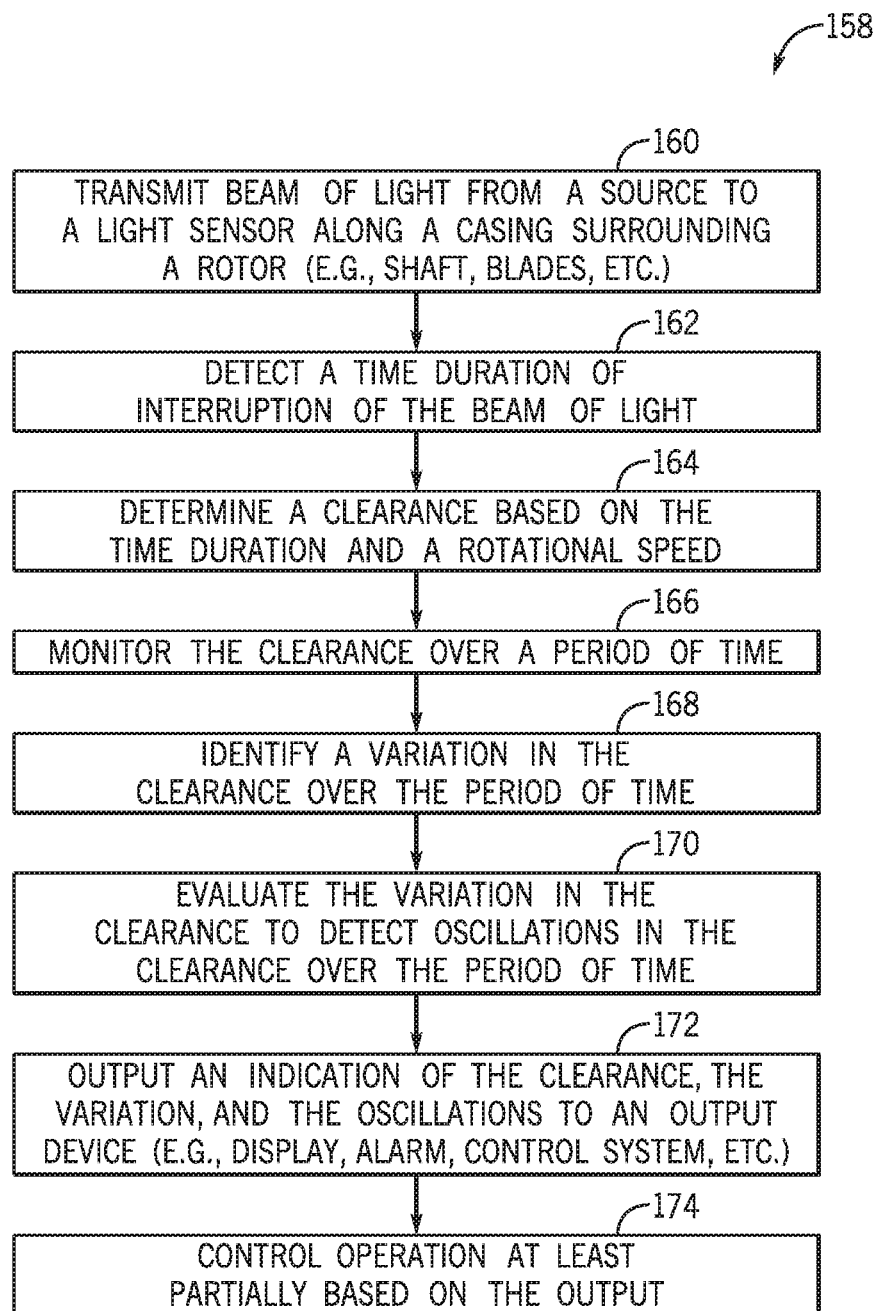
FIG. 7 is a flow chart of an embodiment of a process to measure a clearance between the casing and the blade of the rotor assembly of FIG. 5.

FIG. 7 is a flow chart of an embodiment of a process 158 to measure a clearance 119 between the casing 48 and the blade 44 of the rotor assembly 46 using the measurement system 27 (e.g., the light sensor 18, the light source 16, and the controller 14) of FIG. 5. At block 160, a beam of light (e.g., the light 120) may be transmitted from a light source (e.g., the light source 16) to a light sensor (e.g., the light sensor 18) along a casing (e.g., the casing 48) surrounding a rotor (e.g., rotor blade 44 of the rotor assembly 46). As discussed herein, the rotor may be any suitable rotor, such as the shaft 30, or other rotating object. Indeed, as will be appreciated, the embodiments discussed herein may be widely applicable for determining a clearance 119 between any suitable rotor and a corresponding casing (e.g., housing).

At block 162, the process 158 detects a duration of time of interruption of the beam of light 120. Particularly, the process 158 measures the duration of time that the rotor (e.g., rotor blade 44) blocks the light sensor 18 from receiving the beam of light 120. In some embodiments, the duration of time may be measured by the light sensor 18 and/or the controller 14. At block 164, the process 158 calculates a clearance 119 based at least in part on the duration of time of interruption and a rotational speed of the rotor. In some embodiments, the rotational speed may be a directly measured parameter (e.g., via a rotational speed sensor) or may be predetermined. That is, the rotor may be rotating at a predetermined rotational speed.

Further, in some embodiments, the clearance 119 may be used to further calculate oscillations or vibrations in the rotor. For example, at block 166, the clearance of the rotor may be monitored over time. Particularly, in some embodiments, the clearance 119 between the rotor and the casing 48 may be monitored relative to one or more clearance locations (e.g., the respective clearance locations 144) in the casing. More specifically, a clearance 119 of a particular point on the rotor may be monitored with respect to several clearance locations of the casing 48. Additionally, in some embodiments, multiple points (e.g., multiple rotor blades 44) of the rotor may be monitored with respect to multiple clearance locations of the casing 48. As will be appreciated, the clearance 119 of a particular rotor point may change over consecutive revolutions through a clearance location 144 and/or may change relative to separate clearance locations 144. In other words, the rotor may oscillate and/or vibrate relative to the casing 48 such that the clearance 119 may change over time.

At block 168, the process 158 may identify a variation in the clearance 119 over time. For example, as discussed above, instances of the clearance 119 of the rotor may be monitored relative to the clearance locations 144 along the casing 48. Accordingly, variation (e.g., differences, trends in the clearance) between each monitored (e.g., monitored, measured) instance of the clearance 119 may be monitored with respect to time. At block 170, the variation identified at block 168 may be evaluated to determine oscillations in the clearance 119 over the period of time. Particularly, the variation of the clearance 119 of the rotor over time may indicate that the rotor is oscillating at one or more frequencies. Accordingly, in some embodiments, the frequencies of the oscillations may be determined.

At block 172, the clearance, the variation, and the oscillations of the rotor may be output to an output device. For example, in some embodiments, the output device may be a computer (e.g., the controller 14) having a user interface. Data indicative of the clearance, variation, and/or oscillations may be displayed via the user interface (e.g., an electronic display or monitor). In some embodiments, the data may be portrayed in the form of graphs (e.g., clearance, variation, and/or oscillation with respect to time), graphical representations (e.g., 2D or 3D images) of the rotor, or any other suitable manner.

At block 174, operation of the system 10 may be controlled (e.g., adjusted) based on the output of block 172. For example, in some embodiments, a controller (e.g., the controller 14) may control operation of the system 10 (e.g., the compressor 20) to correct or compensate for any undesirable clearances, variations, and/or oscillations of the rotor. In some embodiments, the control of the operation may be implemented via maintenance or processing a request for maintenance for the rotor.

Figure 8:
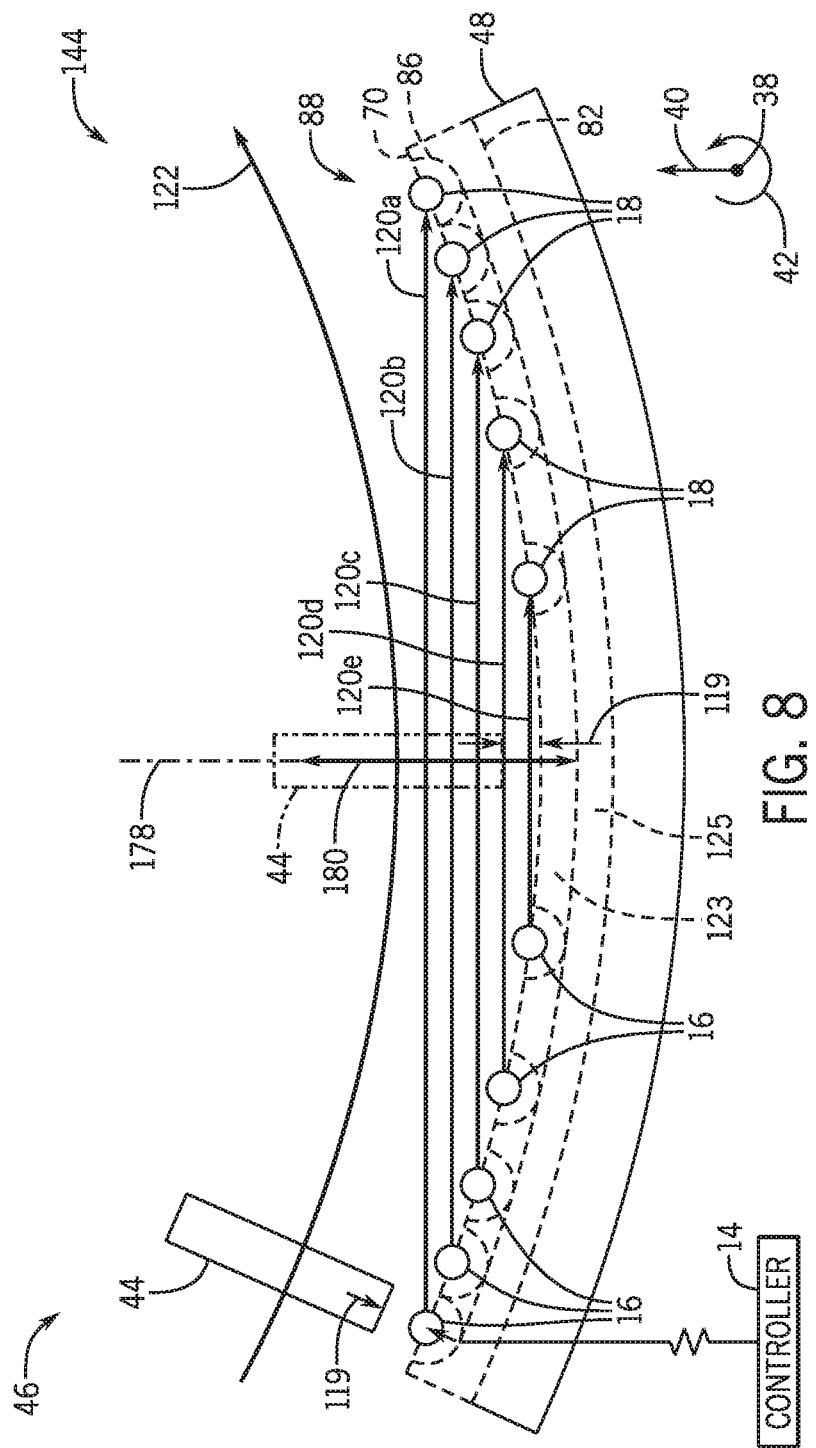
FIG. 8 is a cross-sectional schematic view of an embodiment of the sensor assembly having a plurality of light sources and a plurality of light sensors coupled to one of the sensor mounts in the casing of FIG. 3, illustrating a blade of the rotor assembly moving along an inner circumference of the casing crossing one or more light paths between the light sources and the light sensors.

FIG. 8 is a cross-sectional schematic view of an embodiment of the sensor assembly 88 of the measurement system 27 having a plurality of light sources 16 and a plurality of light sensors 18 coupled to one of the sensor mounts 82 in the casing 48 of FIG. 3, illustrating a blade 44 of the rotor assembly 46 moving along an inner circumference 70 of the casing 48 crossing one or more light paths 120 (e.g., secants along the inner circumference 70) between the light sources 16 and the light sensors 18. The sensor assembly 88 is configured to detect the blade tip clearance 119 of a rotor blade 44 of a rotor assembly 46. For simplicity, FIG. 8 illustrates one rotor blade 44 of the rotor assembly 46. However, the rotor assembly 46 includes a plurality of rotor blades 44 coupled to a central rotor, hub, or shaft, wherein the rotor blades 44 are circumferentially 42 spaced about the axis 32.

As illustrated in the current embodiment, the sensor assembly 88 may include multiple light sources 16 and at least a corresponding number of light sensors 18 (e.g., a 1:1 ratio of light sources 16 and light sensors 18). The sensor assembly 88 arranges the light sources 16 and light sensors 18 in a plurality of pairs, each pair having a light source 16 aligned with a light sensor 18 to define a light path of the light 120. The light paths of the light 120 of the plurality of pairs may be substantially parallel and offset from one another by small radial distances (e.g., in radially stacked beams of light 120), wherein the light paths of the light 120 may be perpendicular to a radius 178 of the casing 48 and substantially tangent to an inner circumference along the internal surface 70 of the casing 48. The illustrated embodiment includes five pairs of five light sources 16 aligned with five light sensors 18 defining light paths 120a through 120e. However, embodiments of the sensor assembly 88 may include at least 2, 3, 4, 5, 6, 7, 8, 9, 10, 11, 12, 13, 14, 15, 20, 25, 30, or more light sources 16 and light sensors 18 arranged in pairs.

The sensor assembly 88 may be disposed in the housing 86 provided via the mount 82. In some embodiments, each of the light sources 16 and the light sensors 18 may be disposed in respective, distinct housings 86. In some embodiments, more than one of the light sources 16 and/or the light sensors 18 may be disposed in a common housing 86.

The light sources 16 and light sensors 18 may be substantially flush or recessed relative to the internal surface 70 (e.g., inner circumference) of the casing 48 and/or the mount 82. Furthermore, the mount 82 may include a transparent material 123 (e.g., a continuous or segmented piece of transparent material) extending along the light paths between the light sources 16 and the light sensors 18. For example, in the illustrated embodiment and each embodiment disclosed herein, the entire mount 82 may be formed of a transparent material, or the mount 82 may include a transparent portion 123 (e.g., a transparent insert or injected transparent material) in a recess or slot 125 extending between the light sources 16 and light sensors 18. The outer surface of the transparent portion 123 may be contoured to substantially match the curvature of the internal surface 70 (e.g., inner circumference) of the casing 48 and/or the mount 82.

As shown, each of the light sources 16 is configured to direct respective lights 120 along light paths toward respective light sensors 18. As mentioned above, each of the lights 120 may be substantially collimated light, such as with substantially no divergence and substantially parallel light rays. Each of the light sensors 18 is configured to detect (e.g., receive) the respective lights 120. Indeed, in some embodiments, each light source 16 may be equal in radial height 180 with a corresponding light sensor 18 (e.g., when measured from a midpoint along a light path of light 120 between the light source 16 and light sensor 18). The radial height 180 may be measured in the clearance location 144 in the radial direction 40 from the internal surface 70 of the casing 48.

In the currently illustrated embodiment, the clearance location 144 may be defined by the circumferential distance (e.g., an angular distance or arc length) along the internal surface 70 of the casing 48 between the light source 16 and the light sensor 18 in a particular pair, e.g., an outermost pair of the light source 16 and light sensor 18. The radial height 180 of each pair of the light source 16 and the light sensor 18 may be defined as the maximum radial height between the light path of the light 120 and the internal surface 70, which may correspond to the radial height at the midpoint between the light source 16 and light sensor 18 of a particular pair. The radial height 180 may progressively increase from one pair to the next in a series of pairs of the light source 16 and light sensor 18, and the incremental change (e.g., increase) in the radial height may be relatively small to provide a finer measurement (or greater accuracy) of the blade tip clearance 119.

Accordingly, the plurality of light paths of light 120 directed from the plurality of light sources 16 to the plurality of light sensors 18 may be radially spaced from the curved surface (e.g., inner circumference 70 or top surface 100) at a plurality of radial heights 180 (e.g., creating radially stacked, parallel light beams). These radial heights 180 may be accurately measured and stored in memory of the controller 14 for use in calculating the blade tip clearance 119 during operation of the system 10.

In some embodiments, each respective light source 16 may transmit the respective light 120 at a distinct and respective wavelength (e.g., color of light). Accordingly, in some embodiments, each respective light sensor 18 may be configured to detect only the respective wavelength of the light 120 being emitted from the corresponding light source 16 (e.g., the light source 16 at the same radial height 180 as the light sensor 18). However, embodiments of the measurement system 27 also may enable each light sensor 18 to detect light from any of the light sources 16, such that an unexpected detection of a wavelength of light 120 at a particular light sensor 18 (or light 120 at an unexpected light sensor 18) may be indicative of an out-of-round condition (e.g., an inner circumference of the casing 48 is not circular), a vibration condition, a misalignment condition, or some other problem.

For example, the sensor assembly 88 includes light sources 16 and light sensors 18 in a first pair at a first radial height, a second pair at a second radial height greater than the first radial height, a third pair at a third radial height greater than the second radial height, a fourth pair at a fourth radial height greater than the third radial height, and a fifth pair at a fifth radial height greater than the fourth radial height. If the light sensor 18 in the third set receives light from the light source 16 in the first, second, fourth, or fifth set, then the light sensor 18 or the controller 14 may identify the unexpected receipt of light 120 (e.g., due to the unexpected wavelength) and identify a misalignment or out-of-round condition and its severity, depending on which wavelength of light is received by the light sensor 18. For example, the controller 14 may be configured to estimate an increasingly greater severity of the misalignment or out-of-round condition if the received wavelength (e.g., at the light sensor 18 in the third set) corresponds to the fifth set rather than the fourth set, or even further out in a sixth, seventh, or eighth set of light sources 16 and light sensors 18.

The rotor blade 44 is configured to rotate along the rotor path 122. As the rotor blade 44 moves along the rotor path 122, the rotor blade 44 moves through the clearance location 144 and may obstruct one or more of the light paths of light 120 that are being transmitted from the light sources 16 toward the light sensors 18. Accordingly, as the rotor blade 44 moves along the rotor path 122 and obstructs one or more of the light paths of light 120 (e.g., parallel light paths radially offset from one another), one or more of the light sensors 18 may not detect (e.g., receive) the light 120 due to the obstruction. The position and detection state (e.g., detecting light or not detecting light) of each light sensor 18 in the sensor assembly 88 is indicative of the blade tip clearance 119, because the light path of light 120 between each pair of the light source 16 and light sensor 18 is disposed at a different radial height 180 (e.g., maximum radial height between each pair of light source 16 and light sensor 18).

In the illustrated embodiment, the sensor assembly 88 includes five pairs of light sources 16 and light sensors 18 to transmit and receive light 120 along five different light paths, e.g., a first light path of light 120a, a second light path of light 120b, a third light path of light 120c, a fourth light path of light 120d, and a fifth light path of light 120e. However, embodiments of the sensor assembly 88 may include any number of pairs (e.g., any number from 2 to 1000 or more) of light sources 16 and light sensors 18 arranged with light paths of light 120 in sequentially greater radial heights 180 away from the internal surface 70 of the casing 48, such than the blade tip clearance 119 may be measured over a greater radial height 180 and/or with a greater accuracy with closer spacing of the light paths of light 120. Rotor blades 44 having greater blade tip clearances 119 may only pass through light paths of light 120 associated with greater radial heights 180 (e.g., pairs of light sources 16 and light sensors 18 disposed further from the internal surface 70). In contrast, rotor blades 44 having lesser blade tip clearances 119 may pass through the lights associated with lesser radial heights 180 as well as the lights 120 associated with the greater radial heights 180.

In the clearance location 144 shown in FIG. 8, the illustrated rotor blade 44 obstructs the light paths of light 120*a*, 120*b*, 120*c*, and 120*d* being sensed by the light sensors 18, while not obstructing the light path of light 120*e* being sensed by the light sensor 18. As a result, the four radially innermost light sensors 18 (i.e., closest to the rotational axis 32 and furthest from the internal surface 70) indicate a light obstruction, while the one radially outermost light sensor 18 (i.e., furthest from the rotational axis 32 and closest to the internal surface 70) indicates no light obstruction. Thus, the controller 14 receives and processes signals from the light sensors 18 to identify the light obstructions and their corresponding positions (e.g., radial heights 180) and the light passage and its corresponding position (e.g., radial height 180) to measure or estimate the blade tip clearance 119. For example, the controller 14 may calculate or estimate the blade tip clearance 119 to be equal to the radial height 180 corresponding to the light path of light 120*e*, which is the only light path of light not obstructed by the rotor blade 44.

However, if multiple light sensors 18 receive light 120 from the light sources 16, then the controller 14 may receive and process the signals from the light sensors 18 to calculate or estimate the blade tip clearance 119 to be equal to the largest radial height 180 of the non-obstructed light paths of light 120. As another example, if the light sensors 18 detect that the rotor blade 44 interrupts the first path of light 120*a* and the second path of light 120*b*, while the light sensors 18 also detect that the rotor blade 44 does not interrupt the third path of light 120*c*, the fourth path of light 120*d*, and the fifth path of light 120*e*, then the controller 14 may receive and process the signals from the light sensors 18 to calculate or estimate the blade tip clearance 119 of the rotor blade 44 to be equal to the radial height 180 corresponding to the light path of light 120*c* (i.e., the greatest radial height 180 of the three non-obstructed paths of light 120*c*, 120*d*, and 120*e*).

The accuracy of the measurement of blade tip clearance 119 is at least partially dependent on the radial spacing between the light paths of light 120 between the different pairs of light sources 16 and light sensors 18. Therefore, the closer the radial spacing, the greater the accuracy of the measurement of blade tip clearance 119. In certain embodiments, the controller 14 may further measure the duration of time of the obstructions of the light paths of light 120 similar to the manner described above with reference to FIGS. 5-7 in combination with the measurement techniques described for FIG. 8, to improve the accuracy and/or to provide redundancy in the measurements of the blade tip clearance 119.

Figure 9:
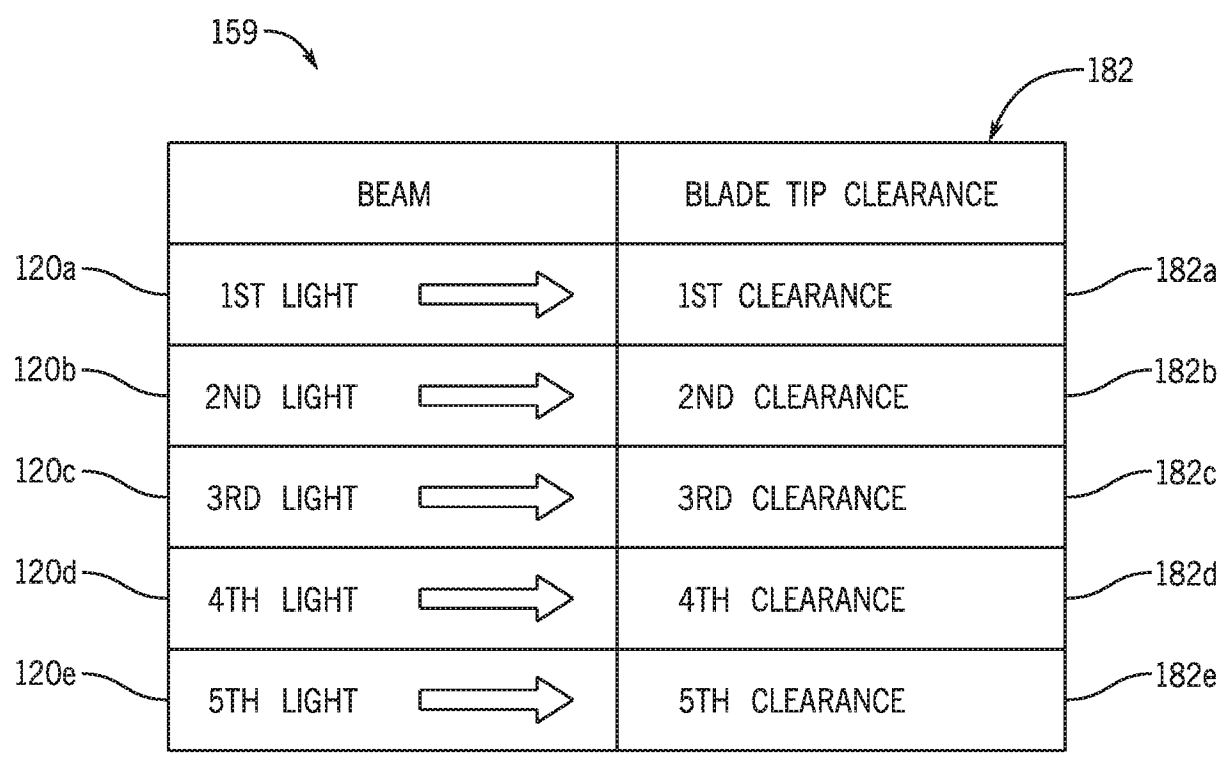

FIG. 9 is an embodiment of a look-up table 159 that the controller 14 may utilize to determine the blade tip clearance 119 between the casing 48 and the blade 44 based on data obtained from the sensor assembly 88 of FIG. 8. The controller 14 may store the look-up table 159 in memory and execute measurement code stored in the memory and executable on a processor to determine the blade tip clearance 119 based on the look-up table and sensor data. As discussed above, each pair of light sources 16 and light sensors 18 has a light path of light 120 associated with a blade tip clearance 119, 182 (e.g., the radial height 180). For example, the first light 120*a* may be associated with a first clearance 182*a*, the second light 120*b* may be associated with a second clearance 182*b*, the third light 120*c* may be associated with a third clearance 182*c*, the fourth light 120*d* may be associated with a fourth clearance 182*d*, and the fifth light 120*e* may be associated with a fifth clearance 182*e*. As shown, the clearances 182 may be in descending order, such that the first clearance 182*a* is greater than the second clearance 182*b*, and so forth.

The controller 14 may receive (from the light sensors 18) data indicative of whether the respective light sensors 18 are receiving (e.g., detecting) or not receiving the respective lights 120. The controller 14 may then utilize the look-up table 159 based on the data to determine the clearance 182. For example, the data received from the light sensors 18 may indicate that the light sensors 18 at least temporarily did not detect the first light 120*a*, the second light 120*b*, and the third light 120*c*, while the light sensors 18 did detect the fourth light 120*d* and the fifth light 120*e*. Accordingly, the controller 14 may determine that the blade tip clearance 119 is less than the third clearance 182*c* and at least equal to the fourth clearance 182*d*, and potentially between the third and fourth clearances 182*c* and 182*d*.

Figure 10:
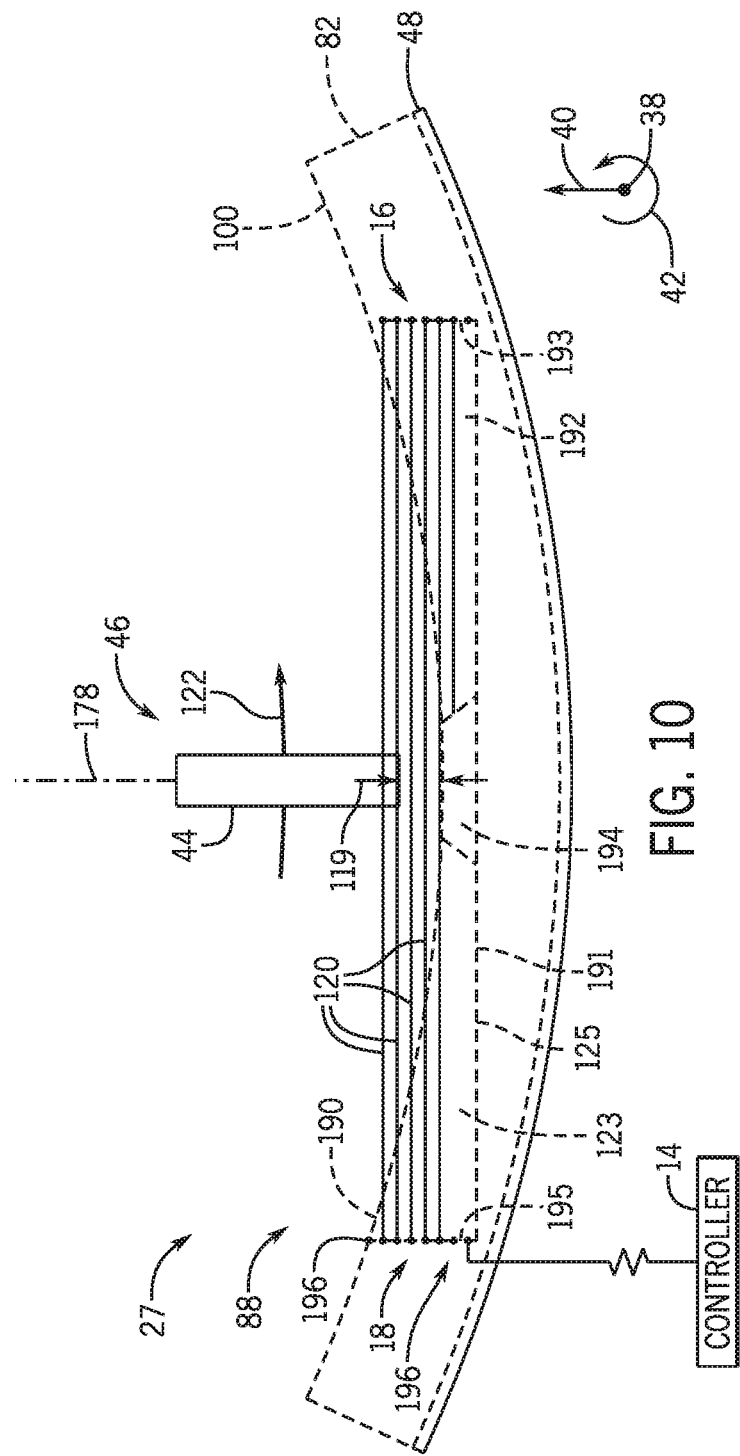
FIG. 10 is a cross-sectional schematic view of an embodiment of the sensor assembly having a plurality of light sources and a plurality of light sensors coupled to one of the sensor mounts in the casing of FIG. 3, illustrating a blade of the rotor assembly moving along an inner circumference of the casing crossing one or more light paths between the light sources and the light sensors.

FIG. 10 is a cross-sectional schematic view of an embodiment of the sensor assembly 88 of the measurement system 27 having a plurality of light sources 16 and a plurality of light sensors 18 coupled to one of the sensor mounts 82 in the casing 48 of FIG. 3, illustrating a blade 44 of the rotor assembly 46 moving along an inner circumference 70 of the casing 48 crossing one or more light paths 120 (e.g., secants along the inner circumference 70) between the light sources 16 and the light sensors 18. As discussed below, the illustrated embodiment of the sensor assembly 88 may be configured to measure the blade tip clearance 119 in substantially the same manner as described above with reference to FIGS. 8 and 9, while further including features to measure roundness (or an out-of-round condition) of the casing 48. For simplicity, FIG. 10 illustrates one rotor blade 44 of the rotor assembly 46. However, the rotor assembly 46 includes a plurality of rotor blades 44 coupled to a central rotor, hub, or shaft, wherein the rotor blades 44 are circumferentially 42 spaced about the axis 32.

As illustrated in the current embodiment, the sensor assembly 88 includes a plurality of pairs of light sources 16 and light sensors 18, each pair having a light source 16 aligned with a light sensor 18 to define a light path of the light 120. The alignment of each pair of light sources 16 and light sensors 18 and the corresponding light path of light 120 may define a secant relative to the curvature (e.g., annular surface) of the internal surface 70 (e.g., inner circumference) of the casing 48 and the top surface 100 of the mount 82. That is, the light path 120 may intersect the curvature of the internal surface 70 at two points.

Furthermore, the plurality of pairs of light sources 16 and light sensors 18 and their corresponding light paths of light 120 may be substantially parallel and radially spaced apart from one another by intermediate gaps (e.g., radial gaps), thereby defining radially stacked beams of light 120 at a plurality of radial heights relative to the internal surface 70. The intermediate gaps may be uniform (or variable) among the plurality of light paths of light 120.

As discussed above, the light sources 16 and the light sensors 18 (e.g., the sensor assembly 88) may be coupled to the mount 82, which is engaged with the track 102 in the casing 48. In some embodiments, the sensor assembly 88 may be coupled to an inset 190 (e.g., depression) of the mount 82. The inset 190 of the mount 82 may be defined by a space of the mount 82 extending below the top surface 100 of the mount 82, wherein the top surface 100 is contoured to match the curvature of the inner circumference of the casing 48. In some embodiments, the inset 190 of the mount 82 may include a transparent material 192, such as the transparent portion 123 (e.g., a transparent insert or injected transparent material) in a recess or slot 125 as discussed above. The transparent material 192 may be a solid medium through which the lights 120 may be transmitted. The light sources 16 may be positioned in the inset 190 to transmit light paths of light 120 at least partially through the inset 190 (e.g., through the transparent material 192) toward the light sensors 18.

For example, in the illustrated embodiment, the light sources 16 are disposed on a first side 193 and the light sensors 18 are disposed on a second side 195 of the inset 190, wherein the first and second sides 193 and 195 may be parallel to one another, such that the spacing between the light sources 16 and the light sensors 18 is uniform in the radial direction 40. However, in certain embodiments, the first and second sides 193 and 195 may be angled relative to one another (e.g., diverging or converging in the radial inward direction), such that the spacing between the light sources 16 and the light sensors 18 varies in the radial direction 40.

Further, in some embodiments, the inset 190 of the mount 82 may include a raised portion 194, which extends radially inwardly away from a base 191 of the transparent material 192 and the recess 125 without extending beyond the top surface 100 (e.g., flush with the top surface 100). The raised portion 194 may be configured to block one or more of the light paths of light 120 transmitted from the light sources 16 toward the light sensors 18. That is, in a round condition of the inner circumference of the casing 48, the raised portion 194 may be configured to block one or more light sensors 18 from receiving the light 120 being transmitted from one or more light sources 16. Moreover, as shown, in some embodiments, the sensor assembly 88 may include one or more auxiliary light sensors 196 not directly paired with a corresponding light source 16. In some embodiments, the light sensors 18 corresponding to the light paths of light 120 blocked by the raised portion 194 may similarly be considered auxiliary light sensors 196. However, the number of auxiliary light sensors 18, 196, may be greater than the corresponding number of light sources 16 directed toward the raised portion 194. The auxiliary light sensors 196 alone or in combination with the light sensors 18 may be utilized to detect a change in roundness of the casing 48. Further, although the currently illustrated embodiment includes three auxiliary light sensors 196, it should be noted that the embodiments discussed herein may include any suitable number of auxiliary light sensors 196.

In some embodiments, a roundness of the casing 48 may change over time. The roundness of the casing 48 may be defined as a measure of how closely the shape of the casing 48 (e.g., the inner circumference 70) approaches that of a mathematically perfect circle. The roundness of the casing 48 may change as the casing 48 experiences thermal expansion and contraction, thermal stress, or other issues during operation of the compressor 20. In some embodiments, when the roundness of the casing 48 changes, the angle at which the lights 120 are transmitted (e.g., an angle of transmission relative to the casing 48) may similarly change. Particularly, in such embodiments, the angles of the lights 120 may change such that the auxiliary light sensors 196 or unintended light sensors 18 may detect one or more of the lights 120. Indeed, detection of the light 120 at the auxiliary light sensors 196 may indicate a change of the roundness of the casing 48. Further, in some embodiments, as the roundness of the casing 48 changes, light sensors 18 positioned to detect light from a particular light source 16 may instead detect light from a different light source 16, which may further indicate a change in the roundness of the casing 48.

For example, as mentioned above, in some embodiments, each light 120 may be associated with a respective wavelength, and the light sensors 18 may correspondingly be configured to detect the respective wavelengths. Accordingly, in some embodiments, as the roundness of the casing 48 changes, and the angle of the lights 120 changes, the wavelength that the respective light sensors 18 may receive may similarly change (e.g., the light sensors 18 may receive unexpected wavelengths of light 120). Thus, a change in roundness of the casing 48 may be determined by the auxiliary light sensors 196 detecting the light 120 and/or the light sensors 18 detecting the light 120 from an unexpected light source 16 due to a change in the angle of transmission of the lights 120.

The controller 14 may be configured to determine an out-of-round condition and its severity by processing the sensed signals from the various light sensors 16 and 196, identifying the light source 16 and the expected position based on the wavelength of the sensed light 120, and calculating an amount of deviation in the roundness based on the deviation in the light path of light 120. For example, if a particular wavelength of light 120 is expected at a particular light sensor 18 in a round condition of the casing 48, then if the particular wavelength of light 120 is received at a light sensor 18 or 196 a number of positions (or distance) away from the expected sensor position, the number of positions (or radial distance) can be used by the controller 14 to determine the severity of the out of round condition. A greater number of positions (or radial distance) may signify a greater deviation in the roundness (i.e., a more severe out-of-round condition), whereas a lesser number of positions (or shorter radial distance) may signify a lesser deviation in the roundness (i.e., a less severe out-of-round condition).

Figure 11:
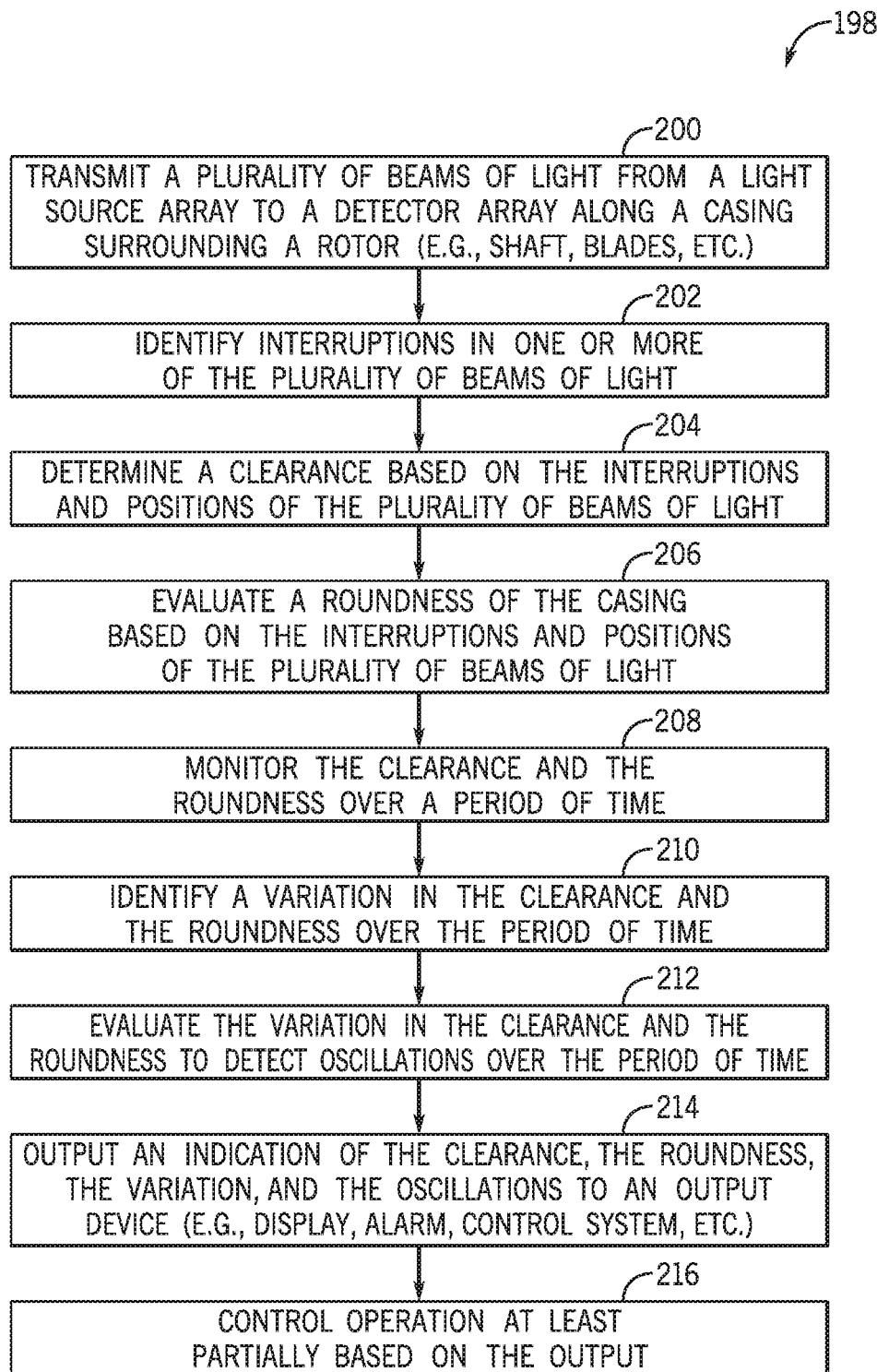
FIG. 11 is a flow chart of an embodiment of a process to measure a clearance between the casing and the blade and a roundness of the casing as illustrated in FIG. 10.

FIG. 11 is a flow chart of an embodiment of a process 198 to measure a clearance 119 between the casing 48 and the blade 44 and a roundness of the casing 48 using the measurement system 27 (e.g., the light sensors 18, the light sources 16, and the controller 14) as illustrated in FIG. 10. At block 200, a plurality of beams of light (e.g., light paths of light 120) may be transmitted from a plurality of light sources (e.g., the light sources 16) toward plurality of light sensors (e.g., the light sensors 18) along a casing (e.g., the casing 48) surrounding a rotor (e.g., the rotor blade 44 of the rotor assembly 46). As discussed herein, the rotor may be any suitable rotor, such as the shaft 30, or other rotating object. Indeed, as will be appreciated, the embodiments discussed herein may widely applicable for determining a clearance between any suitable rotor and a corresponding casing (e.g., housing).

At block 202, the process 198 detects interruptions in the plurality of beams of light 120. Particularly, the process 198 detects whether the light sensors 18 are receiving the plurality of beams of light 120 or if the beams of light 120 are being interrupted (e.g., blocked) prior to reaching the plurality of sensors 18. At block 204, the process 198 calculates or estimates a clearance based on an identity and position of the beams of light 120 successfully reaching the sensors 18 and an identity and position of the beams of light 120 blocked from reaching the sensors 18 based on signals from the light sensors 18 and known positions (e.g., known radial heights of the light paths of light 120 for each pair of light sources 16 and light sensors 18, known blade tip clearances for each light sensor 18, etc.). For example, the process 198 may use the look-up table 159 of FIG. 9.

The process 198 may determine that the clearance 119 of the rotor is less than a radial height associated with a beam of light 120 that is interrupted and thus not detected by the expected light sensor 18, and the process may determine that the clearance 119 of the rotor is at least equal to the radial height associated with a beam of light 120 that is successfully transmitted and received by the expected light sensor 18. If the process 198 identifies multiple light sensors 18 successfully receiving the expected beams of light, then the process 198 may calculate or estimate the blade tip clearance 119 to be equal to the greatest of the radial heights associated with these light sensors 18.

At block 206, the process 198 evaluates the roundness of the casing 48 based on the interruptions and positions of the beams of light 120 and, more specifically, the positions of the light sources 16 emitting the beams of light 120 and the positions of the light sensors 18 receiving the beams of light 120. As discussed above, the roundness of the casing 48 may affect the angles of transmission of the beams of light 120. Accordingly, the light sensors 18 receiving the beams of light 120 may change based on the adjusted angles of transmission of the beams of light 120. The roundness may then be determined based on which of the light sensors 18 are receiving which of the beams of light 120. In some embodiments, each beam of light 120 may include a respective and distinct wavelength (e.g., color of light). Accordingly, as the angles of transmission of the beams of light 120 and the sensors 18 receiving the beams of light 120 changes, the respective wavelengths that the sensors 18 may detect may similarly change. Thus, in some embodiments, the roundness may be based on the positions of the sensors 18 receiving the light and the wavelength that the sensors 18 are receiving, which may be indicative of the positions of the light sources 16 of the respective wavelengths.

At block 208, the process 198 monitors the clearance 119 of the rotor and the roundness of the casing 48 over a period of time. Particularly, in some embodiments, the clearance 119 between the rotor and the casing 48 may be monitored relative to one or more clearance locations (e.g., the respective clearance locations 144) in the casing 48. More specifically, a clearance 119 of a particular point on the rotor may be monitored with respect to several clearance locations of the casing 48. Additionally, in some embodiments, multiple points (e.g., multiple rotor blades 44) of the rotor may be monitored with respect to multiple clearance locations of the casing 48. As will be appreciated, the clearance 119 of a particular rotor point may change over consecutive passes through a clearance location and/or may change relative to separate clearance locations. In other words, the rotor may oscillate and/or vibrate relative to the casing 48 such that the clearance 119 may change over time. Similarly, in some embodiments, the roundness of the casing 48 may be monitored at multiple points along the casing 48, which may correspond with the clearance locations discussed above.

At block 210, the process 198 may identify a variation in the clearance 119 and/or a variation in the roundness over time. For example, as discussed above, instances of the clearance 119 of the rotor and the roundness of the casing 48 may be monitored relative to the clearance locations along the casing 48. Accordingly, variation (e.g., differences, trends in the clearance and/or roundness) between each monitored (e.g., measured) instance of the clearance 119 and/or roundness may be monitored with respect to time. At block 212, the variation identified at block 210 may be evaluated to determine oscillations in the clearance and/or roundness over the period of time. Particularly, variation of the clearance 119 of the rotor over time may indicate that the rotor is oscillating at one or more frequencies. Similarly, variations of the roundness of the casing 48 over time may indicate that the roundness of the casing 48 is oscillating. Accordingly, in some embodiments, the frequencies of the oscillations may be determined.

At block 214, the clearance 119, the roundness, the variation, and the oscillations of the rotor and/or the casing 48 may be output to an output device. For example, in some embodiments, the output device may be a computer (e.g., the controller 14) having a user interface. Data indicative of the clearance 119, the roundness, variation, and/or oscillations may be displayed via the user interface (e.g., an electronic display or monitor). In some embodiments, the data may be portrayed in the form of graphs (e.g., clearance, roundness, variation, and/or oscillation with respect to time), graphical representations (e.g., 2D or 3D images) of the rotor and/or the casing 48, or any other suitable manner.

At block 216, operation may be controlled (e.g., adjusted) based on the output of block 214. For example, in some embodiments, a controller (e.g., the controller 14) may control operation of the system 10 (e.g., the compressor 20) to correct or compensate for any undesirable clearances, roundness, variations, and/or oscillations of the rotor and/or the casing. In some embodiments, the control of the operation may be implemented via maintenance or processing a request for maintenance for the rotor.

Figure 12:
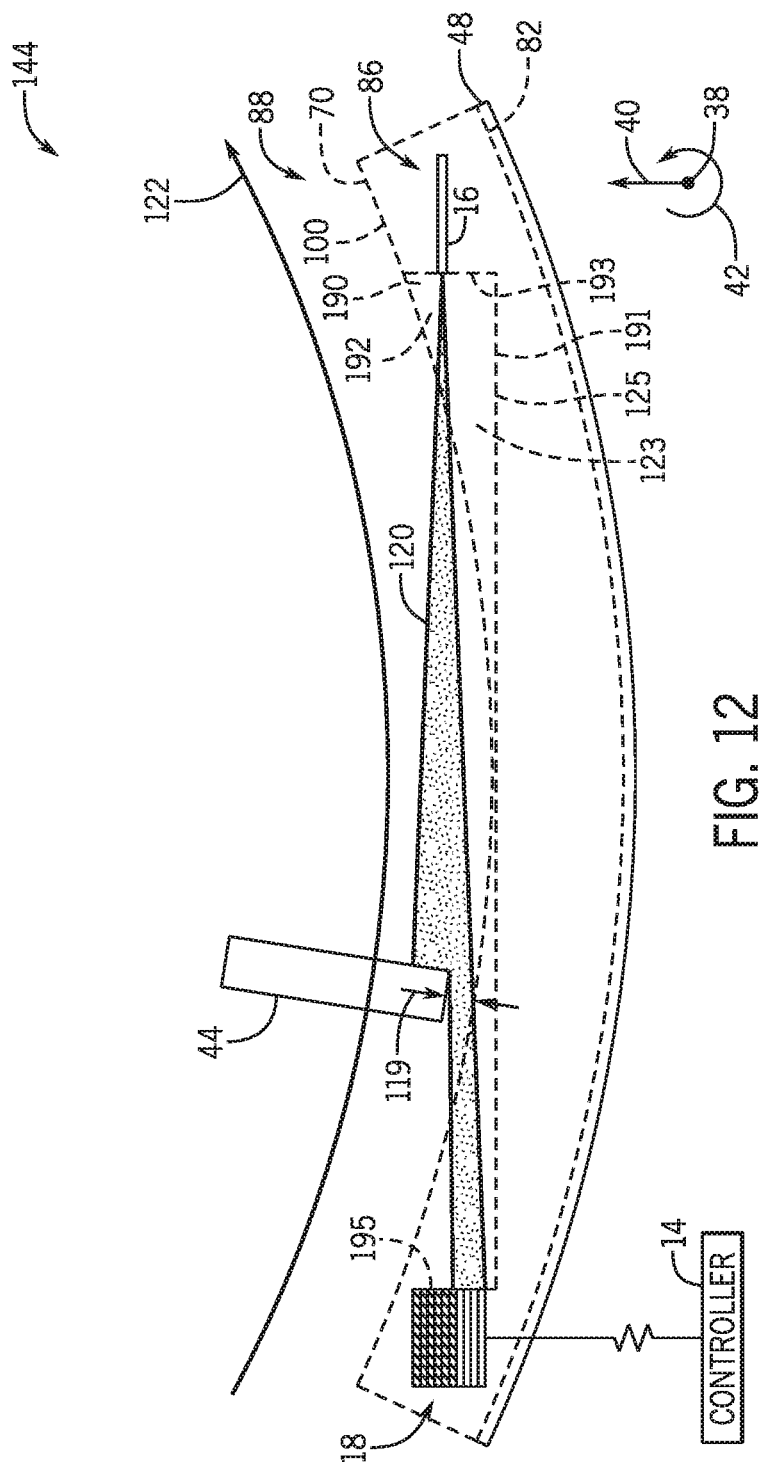
FIG. 12 is a cross-sectional schematic view of an embodiment of the sensor assembly having a common light source and a plurality of light sensors coupled to one of the sensor mounts in the casing of FIG. 3, illustrating a blade of the rotor assembly moving along an inner circumference of the casing crossing at least a portion of a light path between the common light source and the light sensors.

FIG. 12 is a cross-sectional schematic view of an embodiment of the sensor assembly 88 having a common light source 16 and a plurality of light sensors 18 coupled to one of the sensor mounts 82 in the casing 48 of FIG. 3, illustrating a blade 44 of the rotor assembly 46 moving along an inner circumference 70 of the casing 48 crossing at least a portion of a light path of light 120 (e.g., secants along the inner circumference 70) between the common light source 16 and the light sensors 18. The common light source 16 (e.g., single or shared light source) is configured to emit the light 120 simultaneously toward the plurality of light sensors 18. As shown, the light 120 may be a diverging light or a conically shaped light. In some embodiments, the light source 16 and the light sensors 18 may be disposed in the housing(s) 86 of the mount 82. As will be appreciated, the blade tip clearance 119 may be based on the specific light sensors 18 (or a total number of light sensors) detecting the light 120 and/or not detecting the light 120 as the rotor blade 44 interrupts the light 120. For example, the controller 14 may monitor signals from the plurality of light sensors 18 and determine that the blade tip clearance 119 is at least equal to a clearance value based on the specific light sensors 18 (or a total number of light sensors) that are detecting the light 120.

In operation, the rotor blade 44 may move along the rotor path 122 proximate to the clearance location 144 of the casing 48. Indeed, as mentioned above, the sensor assembly 88 may be positioned in the mount 82 to detect the blade tip clearance 119 at the clearance location 144 of the casing 48. Particularly, the clearance location 144 may be defined by an arcuate length of the internal surface 70 of the casing 48 between the light source 16 and the light sensors 18. In some embodiments, the clearance location 144 may be disposed at the midpoint of the arcuate length between the light source 16 and the light sensors 18. As the rotor blade 44 moves along the rotor path 122, the rotor blade 44 may interrupt a portion of the light 120, as shown, such that one or more of the light sensors 18 does not detect (e.g., receive) the light 120.

For example, prior to the rotor blade 44 moving through the clearance location 144, all (or a predetermined amount) of the light sensors 18 may be detecting the light 120. As the rotor blade 44 moves through the clearance location 144, some of the light sensors 18 may be blocked from receiving the light 120. In other words, as the rotor blade 44 moves through the spreading light 120 from the light source 16, the rotor blade 44 casts a shadow on one or more of the light sensors 18. As the rotor blade 44 continues to move through the clearance location 144 and out of the clearance location 144, all of the light sensors 18 may once again receive the light 120. The blade tip clearance 119 is a function of the height of the shadow cast by the passing rotor blade 44 and/or a function of the height of the light 120 bypassing the rotor blade 44. Accordingly, the blade tip clearance 119 may be determined based on the number, position, and/or identity of light sensors 18 receiving the light 120 (i.e., successful transmissions of light 120), or the number, position, and/or identity of light sensors 18 not receiving the light 120 (i.e., interruptions of light 120), as the rotor blade 44 moves through the clearance location 144.

Indeed, the number of the light sensors 18 detecting the light 120 and/or the number of the light sensors 18 not detecting the light 120 as the rotor blade 44 moves through the clearance location 144 may be directly correlated to the blade tip clearance 119 at the clearance location 144. For example, the smaller the blade tip clearance 119, the fewer the number of light sensors 18 that may detect the light 120 and the greater the number of light sensors 18 that may not detect the light 120. Similarly, the larger the blade tip clearance 119, the greater the number of light sensors 18 that may detect the light 120 and the fewer the number of light sensors 18 that may not detect the light 120. The light sensors 18 may send data indicative of whether they are detecting the light 120 to the controller 14. The controller 14 may then determine the blade tip clearance 119 based on the data received from the light sensors 18 (e.g., number of light sensors 18 receiving and/or not receiving the light 120).

Alternatively, or additionally, the specific identity of the light sensors 18 detecting the light 120 as the rotor blade 44 moves through the clearance location 144 may be directly correlated to the blade tip clearance 119 at the clearance location 144. For example, when programming the controller 14, using other measurement techniques, mathematical calculations, computer models, etc., the blade tip clearance 119 may be calculated and stored in memory of the controller 14 for each light sensor 18 receiving light 120. Thus, during later operation, if a particular light sensor 18 receives the light 120, the controller 14 can determine the corresponding blade tip clearance 119 based on the identity of the particular light sensor 18 and the clearance data stored in the memory of the controller 14. If multiple light sensors 18 receive light 120, then the controller 14 can determine the blade tip clearance to be the maximum blade tip clearance 119 associated with those light sensors 18.

Additionally, or alternatively, if multiple light sensors 18 do not receive light 120, then the controller 14 can determine the blade tip clearance to be the minimum blade tip clearance 119 associated with those light sensors 18. In certain embodiments, the data received from the light sensor 18 may provide an identity of that particular light sensor 18 to the controller 14 based on the color or wavelength of light (e.g., by filtering the light received by the light sensor 18), an identifier or positional data embedded in the sensor data, or some other type of identifying information.

In the illustrated embodiment, the light sensors 18 may be stacked in a direction crosswise to the direction of the projection of the light 120 (e.g., a centerline of the light 120) within the housing 86. For example, the light sensors 18 may be stacked along the side 195, which may be parallel, diverging, or converging relative to the side 193 having the light source 16. The side 195 having the light sensors 18 may be directly aligned with a radius of the casing 48 or the side 195 may be slightly angled (e.g., 0 to 30 degrees) relative to the radius. In either case, the light sensors 18 may be described as being positioned at a single circumferential position (e.g., one aligned stack of sensors 18 or radial stack of sensors 18) along the inner circumference 70 of the casing 48.

In the illustrated embodiment, the radial stack of light sensors 18 is recessed below the top surface 100 of the sensor mount 82, such that the light sensors 18 are disposed at a plurality of depths (e.g., radial depths) below the top surface 100. Further, as shown, the light sensors 18 and/or the light source 16 may be disposed within the inset 190 of the mount 82. As discussed above, the inset 190 may include the transparent material 192. The transparent material 192 may be a solid medium through which the light 120 may be transmitted. In some embodiments, the top surface 100 of the mount 82 may be at least partially defined by an upper surface of the transparent material 192, both of which may be contoured to match the curvature of the internal surface 70 (e.g., inner circumference) of the casing 48.

Figure 13:
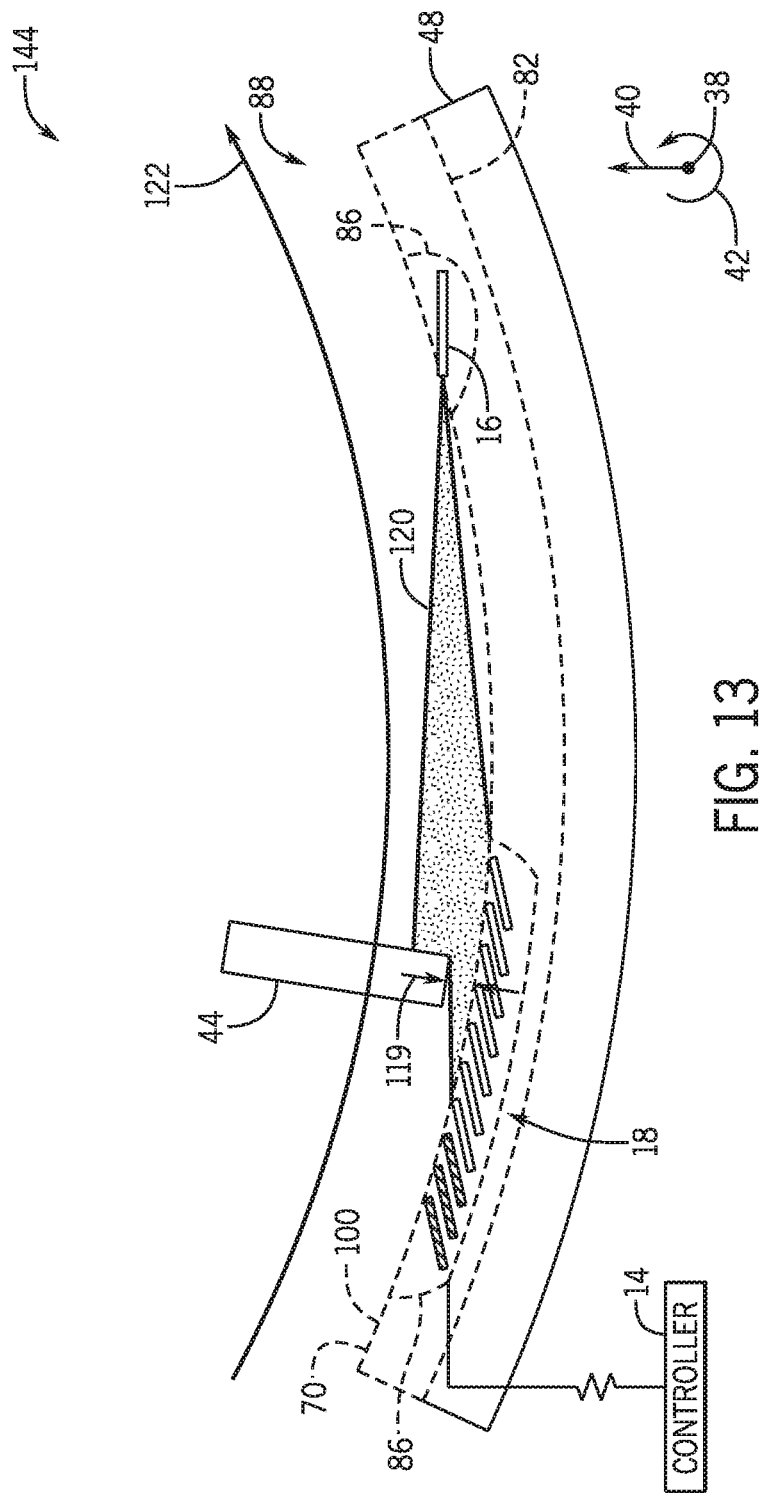
FIG. 13 is a cross-sectional schematic view of an embodiment of the sensor assembly having a common light source and a plurality of light sensors coupled to one of the sensor mounts in the casing of FIG. 3, illustrating a blade of the rotor assembly moving along an inner circumference of the casing crossing at least a portion of a light path between the common light source and the light sensors.

FIG. 13 is a cross-sectional schematic view of an embodiment of the sensor assembly 88 having a common light source 16 and a plurality of light sensors 18 coupled to one of the sensor mounts 82 in the casing 48 of FIG. 3, illustrating a blade 44 of the rotor assembly 46 moving along an inner circumference 70 of the casing 48 crossing at least a portion of a light path 120 (e.g., secants along the inner circumference 70) between the common light source 16 and the light sensors 18. The illustrated embodiment of the sensor assembly 88 may be configured to measure the blade tip clearance 119 in substantially the same manner as described above with reference to FIG. 12. However, rather than a stack of light sensors 18 as shown in FIG. 12, the illustrated embodiment of FIG. 13 has the plurality of light sensors 18 circumferentially 42 spaced apart from one another along the inner circumference 70 of the casing 48 (i.e., multiple circumferential positions over a circumferential distance).

In some embodiments, as shown in FIG. 13, the light sensors 18 may be positioned in the housing 86 of the mount 82, such that the light sensors 18 are spaced in the circumferential direction 42 along the top surface 100 of the mount 82. As discussed above in reference to FIG. 12, the blade tip clearance 119 may be determined based on the number, position, and/or identity of light sensors 18 receiving the light 120 (i.e., successful transmissions of light 120), or the number, position, and/or identity of light sensors 18 not receiving the light 120 (i.e., interruptions of light 120), as the rotor blade 44 moves through the clearance location 144. The controller 14 receives and processes the sensor data from the light sensors 18 and determines the clearance 119 depending on how much light 120 is blocked and/or bypasses the rotor blade 44.

Some embodiments discussed in reference to FIGS. 12 and 13 may incorporate one or more of the features discussed and illustrated in reference to FIG. 10. For example, in some embodiments, the sensor assembly 88 may include one or more of the auxiliary light sensors 196 and/or the raised portion 194. The auxiliary light sensors 196 and the raised portion 194 may function similarly as described above. That is, the auxiliary light sensors 196 may be configured to detect the light 120 as the angle of transmission of the light 120 changes due to changing in the roundness of the casing 48. Further, as described above, the raised portion 194 of the mount 82 may be configured to block a portion of the light 120. In this manner, as the roundness of the casing 48 changes, the portion of the light 120 that the raised portion 194 blocks may similarly change, which may be detected by the light sensors 18. In operation, the controller 14 may be configured to determine the roundness of the inner circumference 70 at least partially based on the interruption or the transmission of light 120 relative to the raised portion 194. Additionally, the controller 14 may be configured to determine the roundness of the inner circumference 70 at least partially based on the transmission of light 120 to one or more unexpected light sensors 18 of the plurality of light sensors 18.

FIG. 14 is a graph 220 representative of an embodiment of data obtained from the sensor assembly 88 of FIGS. 12 and 13 that may be used to determine a clearance 119 between the casing 48 and the blade 44 of the rotor assembly 46. The graph 220 may include a light detection axis 222, which is indicative of the number of the light sensors 18 detecting the light 120. The graph 220 further includes a time axis 224 indicative of time. As discussed above, the blade tip clearance 119 may be determined based on the number of light sensors 18 detecting the light 120 (e.g., a minimum number) during a period of time when the rotor blade 44 passes between the light source 16 and the light sensors 18 (e.g., a blade sensing duration of time), wherein the number of light sensors 18 detecting the light 120 decreases, reaches a local minimum 226, and then increases. The blade tip clearance 119 corresponds to the local minimum 226 illustrated in the graph 220. At this local minimum 226, the controller 14 is configured to determine the blade tip clearance 119 based on a correlation between the number of light sensors 18 detecting light 120 and known blade tip clearances 119 (e.g., based on previous testing, measurements, mathematical calculations, computer models, etc.).

As shown in FIGS. 12 and 13, the axes of the light sensors 18 may be arranged parallel with one another within the mount 82, such that the light paths of light 120 are also parallel to one another. In some embodiments, a lateral distance or spacing between the axes of the light sensors 18 (or the distance between the light paths of light 120) may be dependent on the construction of the light sensors 18. For example, the light sensors 18 may be arranged in direct contact with one another to minimize the spacing between the axes of the light sensors 18 and/or the light sensors 18 may be spaced apart from one another (e.g., with gaps between the sidewalls of the light sensors 18). The light sensors 18 may be arranged in an orderly manner and/or in clusters.

FIG. 15 is a cross-sectional schematic view of an embodiment of an arrangement of the light sensors 18 of the sensor assembly 88 of FIGS. 12 and/or 13, illustrating the light sensors arranged in a tightly packed array 228 (e.g., a one-dimensional arrangement in a column or row 230). In the illustrated embodiment, the opposite lateral sides 227 of the light sensors 18 directly abut one another without any intermediate spacing, and the light sensors 18 are arranged in a single column or row 230. However, the light sensors 18 may have an intermediate spacing between the lateral sides 227 of the light sensors 18 and/or the light sensors 18 may be arranged in multiple rows and columns 230, such as a grid to provide additional light sensors 18 at each radial 40 position. In a grid embodiment, the light sensors 18 may be directly aligned with one another in both rows and columns of the grid. The resolution of the sensor assembly 88 may be dependent on the spacing between the axes of the light sensors 18, which may also be dependent on a diameter 229 of the light sensors 18 and/or fiber optics inside the light sensors 18. In certain embodiments, the diameter of each light sensor 18 (e.g., fiber optic light sensors) may be less than or equal to approximately 3, 4, 5, 6, 7, 8, 9, or 10 thousandth of an inch.

FIG. 16 is a cross-sectional schematic view of an embodiment of a plurality of light sensors 18 of the sensor assembly 88 of FIGS. 12 and/or 13, illustrating the light sensors 18 arranged in a tightly packed array 228 (e.g., a two-dimensional bundle or cluster 232). In the illustrated embodiment, the light sensors 18 are generally staggered relative to one another in both dimensions, e.g., in a radial direction 40 and an axial direction 38. This staggered arrangement of the light sensors 18 in the cluster 232 may improve the resolution of the sensor assembly 88 by placing the sensors 18 in intermediate positions between other adjacent sensors 18 (e.g., midway between the axes of sensors 18 directly abutting one another) in the radial direction 40 and the axial direction 38. Thus, the staggered arrangement of the light sensors 18 in the radial direction 38 may significantly improve the accuracy of the blade tip clearance 119 measurements. For example, the greater the amount of staggering of the sensors 18 in the radial direction 40, the greater the resolution of the sensor assembly 88 and thus the greater the accuracy of the blade tip clearance 119 measurements.

In some embodiments, the cluster 232 of the light sensors 18 may be utilized to monitor a shape of the rotor blade 44 in addition to monitoring the blade tip clearance 119. For example, a shadow cast by the rotor blade 44 on the light sensors 18 as the rotor blade 44 passes through the light 120 may form a silhouette of the rotor blade 44 in the radial and axial directions 40 and 38. Accordingly, detection of the light 120 by the light sensors 18 may be based on the shape of the shadow of the rotor blade 44, and may output data indicative of the shape of the rotor blade 44 to the controller 14. In some embodiments, the controller 14 may utilize the data to create an image (e.g., a profile) of the rotor blade 44. For example, the controller 14 may display the image of the rotor blade 44 via an electronic display or computer monitor. In certain embodiments, the controller 14 may compare the measured shape of the rotor blade 44 against a baseline shape (e.g., an original shape) of the rotor blade 44 and identify deviations between the measured shape and the baseline shape. For example, based on the comparison between the measured and baseline shapes, the controller 14 may identify areas (e.g., tip, sides, etc.) of the rotor blade 44 experiencing wear, rubbing, cracking, surface defects, or other structural problems.

Figure 17:
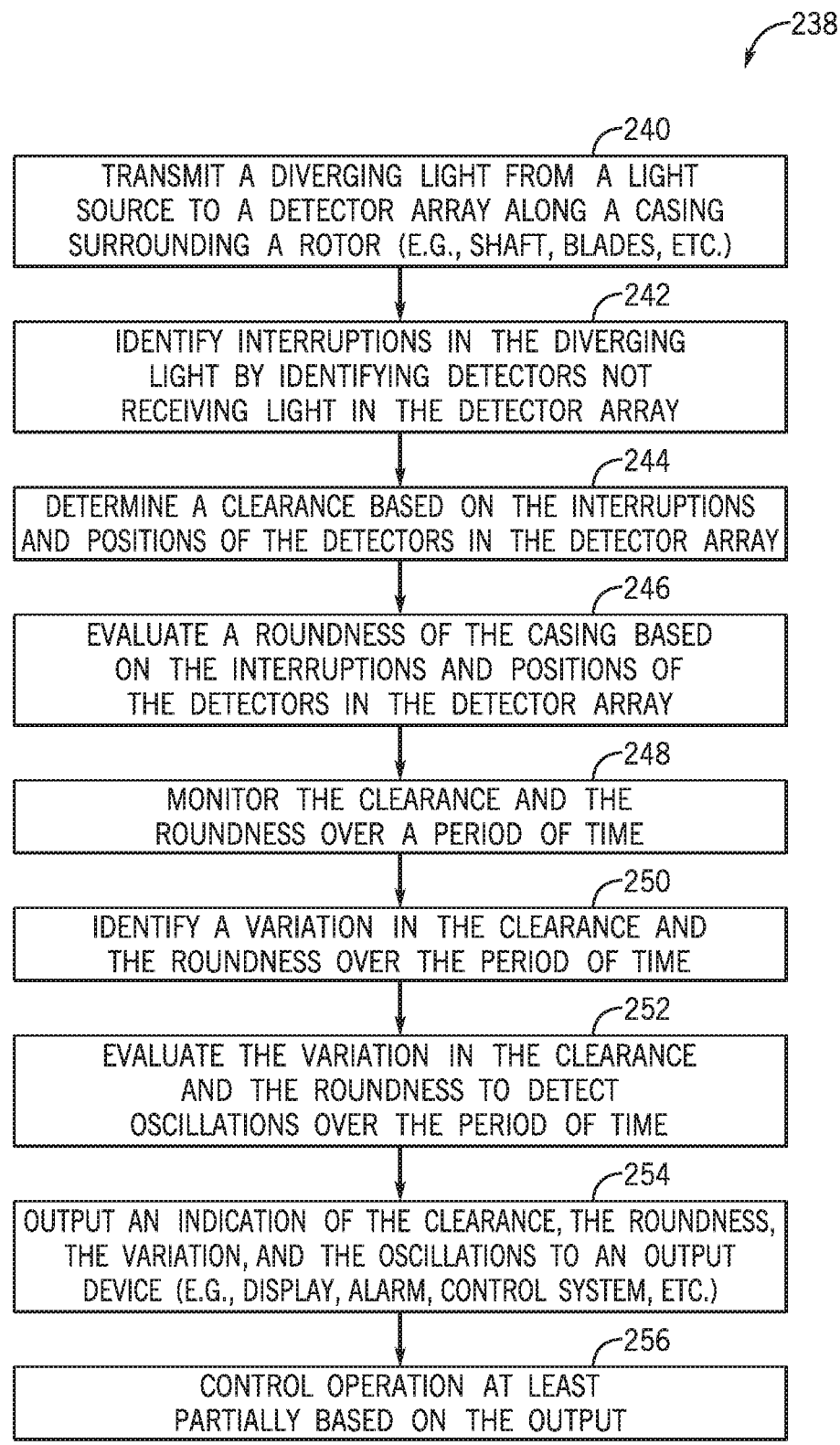
FIG. 17 is a flow chart of an embodiment of a process to measure a clearance between the casing and the blade of the rotor assembly of FIGS. 12 and 13.

FIG. 17 is a flow chart of an embodiment of a process 238 to measure a clearance 119 between the casing 48 and the blade 44 and a roundness of the casing 48 of the rotor assembly 46 using the measurement system 27 (e.g., the light sensors 18, the light source 16, and the controller 14) of FIGS. 12 and 13. At block 240, a diverging light (e.g., the light 120) may be transmitted from a light source (e.g., the light source 16) toward a plurality of light sensors (e.g., the light sensors 18, a detector array) along a casing (e.g., the casing 48) surrounding a rotor (e.g., rotor blade 44 of the rotor assembly 46). As discussed herein, the rotor may be any suitable rotor, such as the shaft 30, or other rotating object. Indeed, as will be appreciated, the embodiments discussed herein may widely applicable for determining a clearance between any suitable rotor and a corresponding casing (e.g., housing).

At block 242, interruptions in the diverging light 120 may be identified by the light sensors 18 and the controller 14. Particularly, the light sensors 18 may detect whether the light sensors 18 are receiving the diverging light 120 or if portions of the diverging light 120 are being interrupted (e.g., blocked) prior to reaching the plurality of sensors 18. At block 244, a clearance 119 may be determined by the controller 14 based on a number of the light sensors 18 that are not detecting the light 120. Indeed, the greater the blade tip clearance 119, the greater the number of light sensors 18 that may detect the light 120. In some embodiments, the blade tip clearance 119 may be determined based on positions of the light sensors 18 and whether or not they detect the light 120. In other words, the blade tip clearance 119 may be directly related to the positions of the light sensors 18 that are blocked from receiving the light 120.

At block 246, the roundness of the casing 48 may be evaluated by the controller 14 based on the interruptions of the light 120. As discussed above, the roundness of the casing 48 may affect an angle of transmission of the diverging light 120. Accordingly, the sensors 18 receiving the diverging light 120 may change based on the adjusted angle of transmission of the diverging light 120. The roundness may then be determined by the controller 14 based on which of the sensors 18 receive the light 120.

Further, in some embodiments, the clearance 119 and the roundness may be used to further calculate oscillations/vibrations in the rotor and/or the casing 48. For example, at block 248, the clearance 119 of the rotor and the roundness of the casing 48 may be monitored over time. Particularly, in some embodiments, the clearance 119 between the rotor and the casing 48 may be monitored relative to one or more clearance locations (e.g., the respective clearance locations 144) in the casing 48. More specifically, a clearance 119 of a particular point on the rotor may be monitored with respect to several clearance locations of the casing 48. Additionally, in some embodiments, multiple points (e.g., multiple rotor blades 44) of the rotor may be monitored with respect to multiple clearance locations of the casing 48. As will be appreciated, the clearance 119 of a particular rotor point may change over consecutive passes through a clearance location and/or may change relative to separate clearance locations. In other words, the rotor may oscillate and/or vibrate relative to the casing 48 such that the clearance 119 may change over time. Similarly, in some embodiments, the roundness of the casing 48 may be monitored at multiple points along the casing 48, which may correspond with the clearance locations discussed above.

At block 250, a variation in the clearance 119 and the roundness over time may be identified by the controller 14. For example, as discussed above, instances of the clearance 119 of the rotor and the roundness of the casing 48 may be monitored relative to the clearance locations along the casing 48. Accordingly, variations (e.g., differences, trends in the clearance 119 and/or roundness) between each monitored (e.g., measured) instance of the clearance 119 and/or roundness may be monitored with respect to time by the controller 14. At block 252, the variation identified at block 250 may be evaluated by the controller 14 to determine oscillations in the clearance 119 and/or roundness over the period of time. Particularly, variations in the clearance 119 of the rotor over time may indicate that the rotor is oscillating at one or more frequencies. Similarly, variations of the roundness of the casing 48 over time may indicate that the roundness of the casing 48 is oscillating. Accordingly, in some embodiments, the frequencies of the oscillations may be determined.

At block 254, the clearance 119, the roundness, the variation, and the oscillations of the rotor and/or the casing 48 may be output to an output device. For example, in some embodiments, the output device may be a computer (e.g., the controller 14) having a user interface (e.g., an electronic display or computer monitor). Data indicative of the clearance 119, the roundness, variation, and/or oscillations may be displayed via the user interface. In some embodiments, the data may be portrayed in the form of graphs (e.g., clearance 119, roundness, variation, and/or oscillation with respect to time), graphical representations (e.g., 2D or 3D images) of the rotor and/or the casing 48, or any other suitable manner.

At block 256, operation of the system 10 may be controlled (e.g., adjusted) by the controller 14 based on the output of block 254. For example, in some embodiments, a controller (e.g., the controller 14) may control operation of the compressor 20 to correct any undesirable clearances, roundness, variations, and/or oscillations of the rotor and/or the casing 48. In some embodiments, the control of the operation may be implemented via maintenance or processing a request for maintenance for the rotor and/or the casing 48 of the compressor 20.

Figure 18:
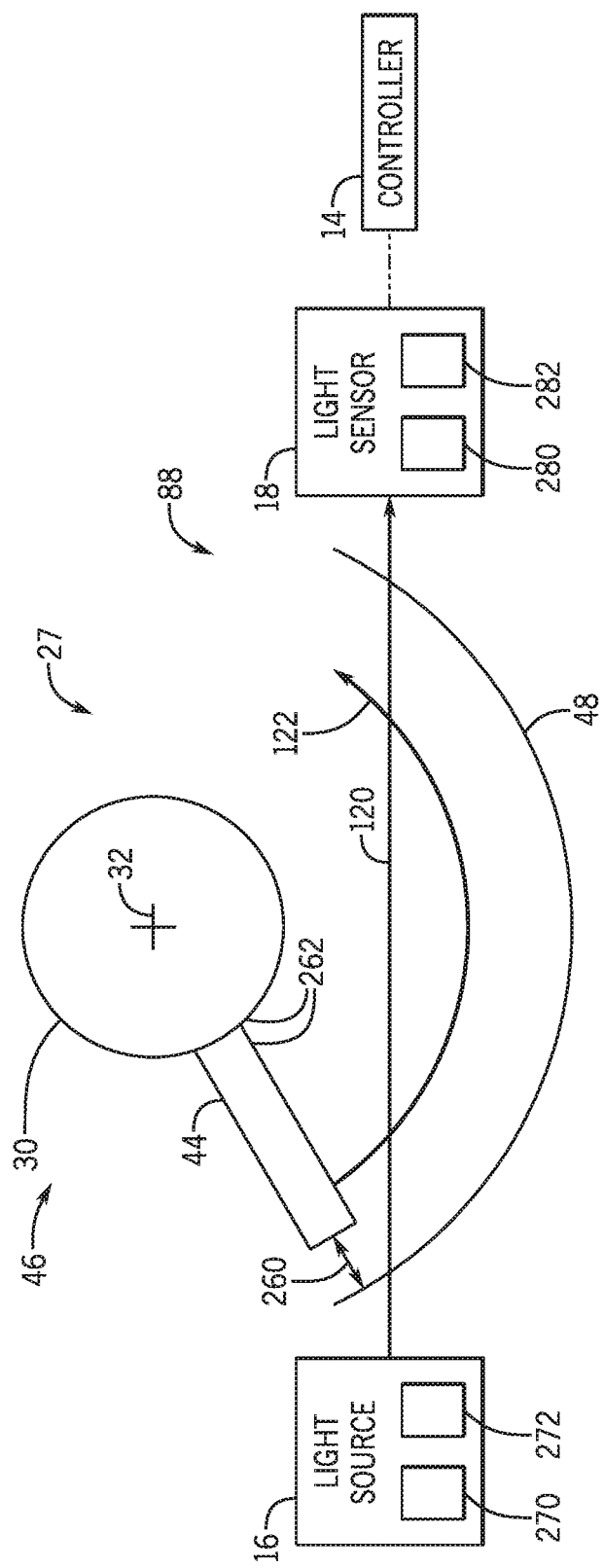
FIG. 18 is a schematic view of an embodiment of a measurement system that may be utilized to measure a clearance between a rotor assembly (e.g., rotor, blades, or both) and a casing surrounding the rotor assembly.

FIG. 18 is a schematic view of an embodiment of a measurement system 27 that may be utilized to measure a clearance 260 (e.g., the blade tip clearance 119) between a rotor assembly 46 (e.g., rotor 262, blades 44, shaft 30, etc.) and a casing 48 surrounding the rotor assembly 46. The measurement system 27 may include one or more light sources 16, one or more light sensors 18, and the controller 14 as described above with reference to FIGS. 5-17. The light source 16 is configured to transmit the light 120 toward the light sensor 18. In some embodiments, the light source 16 may include a broadband light source 270, which is configured to transmit broadband light (e.g., white light) toward the light sensor 18. The broadband light source 270 may be configured to transmit collimated light and/or diverging light. In some embodiments, the light source 16 may include a single color or wavelength light source 272. The single wavelength light source 272 may be configured to direct collimated light of a single wavelength, such as of particular light color, toward the light sensor 18.

The light 120 (e.g., one or more collimated lights, one or more light beams, a diverging light) may be transmitted from the light source 16 toward the light sensor 18. At the same time, the rotor 262 (e.g., blade 44) may travel along the rotor path 122 to block (e.g., interrupt) the light 120 or a portion of the light 120. Accordingly, as discussed in detail above with reference to FIGS. 5-17, the rotor clearance 260 may be determined by the controller 14 based on the interruption of the light 120 by the rotor 262 (e.g., blade 44) and known information (e.g., previous measurements) correlating the interruption of the light 120 with various clearance 260 values.

The light sensor 18 is configured to detect the light 120 being transmitted from the light source 16. In some embodiments, the light sensor 18 may include fiber optic sensor(s). In some embodiments, the light sensor 18 may include one or more spectrometers 280. The spectrometer 280 is configured to detect the light 120 and, more specifically, may detect a color or wavelength of the light 120. In some embodiments, the light sensor 18 may include one or more optical filters 282. The optical filters 282 are configured to filter the light received by the light sensor 18. Particularly, in some embodiments, such as embodiments including multiple light sensors 18, each light sensor 18 may include a respective optical filter 282. The light 120 received by the respective light sensors 18 may be filtered through the optical filter 282 to the spectrometer 280. That is, the optical filter 282 may be configured to filter out one or more particular colors or wavelengths of the light 120. The spectrometer 280 may then determine which of the light sensors 18 are receiving the light 120 based on the filtered light that the spectrometer 280 receives.

The light sensor 18 may be communicatively coupled to the controller 14. In this way, the light sensor 18 may transmit data indicative of detection of the light 120. Particularly, the data may be indicative of whether or not the light sensor 18 is detecting the light, a color or wavelength of detected light, a duration of light detection, a position of the light sensors, or a combination thereof. As discussed herein, the controller 14 may then determine the rotor clearance 260 based on the data received from the light sensor 18 using any of the techniques described above with reference to FIGS. 5-17.

Technical effects of the present disclosure include a system and method for determining a clearance 119 between a rotor (e.g., blade 44) and a casing 48 surrounding the rotor. The system may include a light measurement system 27 having a light source 16 configured to transmit light 120 toward a light sensor 18. The light 120 may be transmitted as a secant relative to an arcuate surface of the casing 48. The rotor (e.g., blade 44) may rotate through the light 120 such that the light 120 is interrupted from reaching the light sensor 18. The light sensor 18 may output data indicative of the interruption to the controller 14. The controller 14 may then determine the clearance 119 based on the data. In this manner, the clearance 119 may be accurately determined. In some instances, the clearance 119 may be further utilized in controlling operation of the compressor 20.

This written description uses examples to disclose the subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The features of FIGS. 1-18 may be combined in any suitable manner.

The invention claimed is:

1. A system, comprising:
a measurement system, comprising:
a common light source;
a plurality of light sensors; and
a controller coupled to the common light source and the plurality of light sensors, wherein the controller is configured to monitor one or more parameters between a rotor and a casing at least partially based on an interruption or a transmission of light from the common light source to the plurality of light sensors.

2. The system of claim 1, wherein the light output by the common light source comprises a diverging light, a portion of the rotor casts a shadow on one or more of the plurality of light sensors when passing between the common light source and the plurality of light sensors, and the plurality of light sensors are configured to sense the diverging light when not interrupted by the portion of the rotor.

3. The system of claim 1, wherein the one or more parameters comprise a clearance between the rotor and the casing.

4. The system of claim 3, wherein the clearance is between a tip of a blade of the rotor and a curved surface of the casing.

5. The system of claim 3, wherein the controller is configured to determine the clearance at least partially based on a number, a position, or an identity of the plurality of light sensors receiving or not receiving the light from the common light source.

6. The system of claim 3, wherein the controller is configured to determine the clearance at least partially based on a minimum number of the plurality of light sensors receiving the light from the common light source when a portion of the rotor passes between the common light source and the plurality of light sensors.

7. The system of claim 3, wherein the controller is configured to determine the clearance at least partially based on an identity and a position of the plurality of light sensors receiving and not receiving the light from the common light source when a portion of the rotor passes between the common light source and the plurality of light sensors.

8. The system of claim 1, wherein the one or more parameters comprise a roundness of a circumference.

9. The system of claim 8, wherein the roundness of the circumference corresponds to an inner circumference of the casing.

10. The system of claim 8, wherein the measurement system comprises a raised portion disposed between the common light source and the plurality of light sensors, and the controller is configured to determine the roundness of the circumference at least partially based on the interruption or the transmission of light relative to the raised portion.

11. The system of claim 8, wherein the controller is configured to determine the roundness of the circumference at least partially based on an unexpected transmission of light to one or more light sensors of the plurality of light sensors.

12. The system of claim 1, wherein the plurality of light sensors are disposed in a plurality of radial positions.

13. The system of claim 12, wherein the plurality of light sensors comprise a single radial stack of fiber optic sensors.

14. The system of claim 12, wherein the plurality of light sensors comprise a two-dimensional bundle of fiber optic sensors.

15. The system of claim 12, wherein the plurality of radial positions are disposed at a plurality of depths relative to a curved surface along a rotational path between the rotor and the casing.

16. The system of claim 1, wherein the plurality of light sensors are disposed in a plurality of circumferential positions in a curved surface along a rotational path between the rotor and the casing.

17. The system of claim 1, comprising a sensor mount supporting the common light source and the plurality of light sensors, wherein the common light source is circumferentially spaced apart from the plurality of light sensors relative to an axis of rotation of the rotor, and the sensor mount is configured to mount in a circumferential groove along a curved surface of the casing.

18. The system of claim 1, comprising a machine having the rotor and the casing, wherein the measurement system is coupled to the machine, and the machine comprises a compressor, a turbine, or a combination thereof.

19. A system, comprising:

a measurement system, comprising:

a sensor mount having a top surface;

a common light source coupled to the sensor mount; and a plurality of light sensors coupled to the sensor mount, wherein the common light source is circumferentially spaced apart from the plurality of light sensors, and the measurement system is configured to monitor one or more parameters at least partially based on an interruption or a transmission of light from the common light source to the plurality of light sensors.

20. A method, comprising:

transmitting light from a common light source toward a plurality of light sensors in a curved surface along a rotational path between a rotor and a casing; and monitoring one or more parameters between the rotor and the casing at least partially based on an interruption or a transmission of light from the common light source to the plurality of light sensors.

* * * * *